(12) United States Patent
Terauchi

(10) Patent No.: US 6,846,732 B2
(45) Date of Patent: Jan. 25, 2005

(54) SEMICONDUCTOR DEVICE FABRICATION METHOD

(75) Inventor: Takashi Terauchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/337,733

(22) Filed: Jan. 8, 2003

(65) Prior Publication Data

US 2004/0018707 A1 Jan. 29, 2004

(30) Foreign Application Priority Data

Jul. 26, 2002 (JP) ........................................ 2002-217945

(51) Int. Cl.[7] ......................................... H01L 21/3205
(52) U.S. Cl. ........................ 438/586; 438/258; 438/587; 438/595
(58) Field of Search ................................ 438/586, 587, 438/595, FOR 196, 258

(56) References Cited

U.S. PATENT DOCUMENTS

| | | | | |
|---|---|---|---|---|
| 5,783,471 | A | * | 7/1998 | Chu ........................... 438/257 |
| 6,235,619 | B1 | * | 5/2001 | Miyakawa .................. 438/585 |
| 6,541,361 | B2 | * | 4/2003 | Ko et al. ..................... 438/585 |
| 6,583,004 | B2 | * | 6/2003 | Kim ........................... 438/241 |
| 2002/0020860 | A1 | * | 2/2002 | Arai ........................... 257/260 |
| 2002/0030215 | A1 | * | 3/2002 | Oashi et al. ................. 257/306 |
| 2002/0068423 | A1 | * | 6/2002 | Park et al. ................... 438/586 |

FOREIGN PATENT DOCUMENTS

| | | |
|---|---|---|
| JP | 2000-49342 | 2/2000 |
| JP | 2001-284452 | 10/2001 |

OTHER PUBLICATIONS

Y. Kohyama et al., "A Fully Printable, Self–aligned and Planarized Stacked Capacitor DRAM Cell Technology for 1 Gbit DRAM and Beyond", 1997 Symposium on VLSI Technology Digest of Technical Papers, pp. 17–18.

* cited by examiner

*Primary Examiner*—George Fourson
*Assistant Examiner*—Joannie Adelle Garcia
(74) *Attorney, Agent, or Firm*—McDermott Will & Emery LLP

(57) ABSTRACT

A semiconductor device fabrication method includes the steps of: forming a gate protection film covering a top face and side face of a gate electrode; forming an interlayer insulation film that is more readily etched than the gate protection film; removing the interlayer insulation film until the top face of the gate protection film is exposed; etching the interlayer insulation film and the gate protection film using a predetermined etchant with a resist film as a mask to form a pad contact hole; forming a conductor film; and forming a pad contact by leaving a portion of a conductor film in the pad contact hole, and removing the remaining portions of the conductor film. The fabrication method provides a semiconductor device that has a structure in which short-circuiting will not be developed between a pad contact and a gate interconnection, and between pad contacts.

6 Claims, 32 Drawing Sheets

1001  1002

1001  1002

SEMICONDUCTOR DEVICE FABRICATION METHOD

BACKGROUND OF THE INVENTION

1. Field of the Invention

The present invention generally relates to a method of fabricating a semiconductor device, particularly to a method of fabricating a semiconductor device including a pad contact formed by self-alignment.

2. Description of the Background Art

Due to microminiaturization of memory cells in accordance with the larger scale integration of the semiconductor device, it has become difficult to form a contact at the gap between interconnections by means of only a photoresist mask without developing any short-circuiting of the wiring. Self-alignment is known as one technique to form a contact at the gap between interconnections without developing shorting therebetween. A self-aligning contact technique for a semiconductor device employing self-alignment is disclosed in Japanese Patent Laying-Open No. 2001-284452 as conventional art.

FIGS. 47–52 show the steps of the self-aligning contact technique for a semiconductor device disclosed in Japanese Patent Laying-Open No. 2001-284452. FIGS. 47, 48 and 50–52 are sectional views, and FIG. 49 is a plan view thereof.

Referring to FIG. 47, 2001 and 2002 designate a memory cell region and a peripheral circuit region, respectively, of a DRAM (Dynamic Random Access Memory) device. An element isolation film 113 that defines an active region is formed at a predetermined region of a semiconductor substrate 111. On semiconductor substrate 111 where element isolation film 113 is formed, a gate oxide film 115, a word line 117 formed of a conductor, a capping insulation film 119, and a hard mask pattern 121 are sequentially formed. Capping insulating film 119 and hard mask pattern 121 are formed of a silicon nitride film and a silicon oxide film. Accordingly, word line patterns 123a and 123b, each formed of word line 117, capping insulation film 119 and hard mask pattern 121, are configured at the memory cell region and the peripheral circuit region, respectively. Using word line patterns 123a and 123b, and element isolation film 113 as a mask, n type impurities are implanted into the active region to form impurity regions 124a, 124b and 124 of low impurity concentration.

Referring to FIG. 48, a spacer 125 which is a silicon nitride film is formed on the sidewall of word line patterns 123a and 123b. In the peripheral circuit region, using word line pattern 123b, spacer 125 and element isolation film 113 as a mask, n type impurities of high dosage are implanted to form an LDD type source/drain region 126. An etching stop film 127 is formed so as to cover semiconductor substrate 111, spacer 125 and hard mask pattern 121. Etching stop film 127 is formed of a silicon nitride film having an etching selectivity of at least a predetermined level with respect to an interlayer insulation film 129 that will be formed at a subsequent step. Interlayer insulation film 129 formed of, for example, an oxide film of high density, is disposed so as to cover etching stop film 127. Interlayer insulation film 129 having a relatively thin thickness is disposed on the memory cell region of high pattern density.

FIG. 49 is a plan view of the memory cell region of semiconductor substrate 111 at the surface side. The cross section taken along line L—L in FIG. 49 corresponds to the cross section of the memory cell region shown in FIGS. 47, 48, and 50–52. Referring to FIG. 49, a plurality of active regions 101 are formed in semiconductor substrate 111. A plurality of word line patterns 123a are formed so as to transverse active region 101. On interlayer insulation film 129 is provided an etching mask having a mask pattern 105 of a bar shape.

Referring to FIG. 50, interlayer insulation film 129 is subjected to anisotropic etching using the etching mask with mask pattern 105. Then, etching stop film 127 is etched to form self-aligned pad contact holes H1 and H2.

Referring to FIG. 51, a conductor film 131 of polysilicon, for example, is formed so as to fill self-aligned pad contact holes H1 and H2, and cover word line pattern 123a.

Referring to FIG. 52, the entire surfaces of conductor film 131 and interlayer insulation film 129 are etched by chemical mechanical polishing until the top surface of word line pattern 123a in the memory cell region is exposed. Thus, conductive pads 131a and 131b are formed in the memory cell region. An upper interlayer insulation film 133 is formed on conductive pads 131a and 131b and word line pattern 123a. Upper interlayer insulation film 133 is given a pattern to form a storage node contact 135 reaching conductive pad 131a.

By such a self-aligning contact technique through self-alignment, word line 117 which is the gate line is prevented from being etched by virtue of etching stop film 127 in the anisotropic etching step of interlayer insulation film 129 since etching stop film 127 has an etching selectivity of at least a predetermined level to interlayer insulation film 129. In the subsequent etching step of etching stop film 127, capping insulation film 119, hard mask pattern 121 and spacer 125 of sufficient thickness remain at the top face and both side faces of word line 117. Therefore, conductive pads 131a and 131b can be formed in self-aligned pad contact holes H1 and H2 avoiding shorting of word line 117.

In the above-described process of self-aligned contact technique, the entire surfaces of conductive film 131 and interlayer insulation film 129 are etched by chemical mechanical polishing until the top surface of word line pattern 123a is exposed. By this step, conductive pads 131a and 131b formed between respective word line patterns 123a are electrically isolated from each other to prevent shorting between the pad contacts.

In the above self-aligned contact technique, conductor film 131 and interlayer insulation film 129 must be polished simultaneously through chemical mechanical polishing in the formation of self-aligned pad contact holes H1 and H2. This polishing must be conducted until the top face of word line pattern 123a in the memory cell region is exposed, taking into consideration variation in the film thickness of interlayer insulation film 129. In the case where the thickness of interlayer insulation film 129 varied so much that polishing down to the predetermined position could not be conducted, conductive film 131 will remain on top of word line pattern 123a. This may cause conductive pads 131a and 131b to develop short-circuiting with each other.

On the other hand, in the case where polishing is conducted deeper than the predetermined position, capping insulation film 119 and hard mask pattern 121 which are the protection film may be completely etched away to result in exposure of word line 117. This exposure of word line 117 will cause shorting to be developed between word line 117 and conductive pads 131a and 131b.

Reflecting the microminiaturization of memory cells during the past several years, the distance between word line patterns 123a has become smaller. In order to reduce the aspect ratio of self-aligned pad contact holes H1 and H2 in such state of affairs, the height of word line pattern 123a must be designed as low as possible. In many cases, this imposes limitation on the film thickness of capping insulation film 119 and hard mask pattern 121. It is for this reason that the possibility of short-circuiting between word line 117 and conductive pads 131a and 131b becomes higher.

SUMMARY OF THE INVENTION

In view of the foregoing problems, an object of the present invention is to provide a method of fabricating a semiconductor device having a structure absent of short-circuiting between a pad contact and a gate line, and absent of short-circuiting between each pad contacts.

According to an aspect of the present invention, a semiconductor device fabrication method includes the steps of: forming a plurality of gate electrodes in a memory cell region on a main surface of a semiconductor substrate including a memory cell region and a peripheral circuit region defined in plane; forming a gate protection film covering a top face and side face of the gate electrode, forming an impurity region of a first conductivity type at the main surface of the semiconductor substrate located at both sides of the gate electrode; forming an interlayer insulation film so as to cover the semiconductor substrate and the gate protection film, and more readily etched away than the gate protection film when a predetermined etchant is used; removing the interlayer insulation film until the top face of the gate protection film is exposed; forming on the interlayer insulation film a mask film having an opening that exposes at least a portion of the exposed gate protection film; etching the interlayer insulation film and gate protection film using a predetermined etchant with the mask film as a mask to form a hole that reaches the impurity region and that has at least a portion of a side plane defining that hole formed by the gate protection film; forming a conductor film so as to fill the hole and cover the interlayer insulation film; and forming a pad contact in the hole by leaving a portion of the conductor film in the film and removing other portions of the conductor film.

According to the semiconductor device fabrication method of the above aspect, an interlayer insulation film is formed and then removed until the top surface of the gate protection film is exposed. Therefore, in the step of leaving a portion of the conductor film in the hole and removing other portions of the conductor film, the object of removal is only the conductor film. The interlayer insulation film does not have to be removed. This means that the conductor film can be removed taking into consideration only variation in the film thickness of the conductor film. Variation in the film thickness of the interlayer insulation film does not have to be taken into account. Thus, the problem of adjacent pad contacts being short-circuited with each other due to the presence of the conductor film remaining at regions other than in the hole, originated from a great variation in the film thickness of the interlayer insulation film, can be overcome. Similarly, the problem of the gate electrode and the pad contact being short-circuited due to the gate protection film located on the top face of the gate electrode being completely removed during the step of removing the conductor film in the hole can be overcome.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2–19 show respective steps in the method of fabricating the semiconductor device of FIG. 1, wherein FIGS. 2–9 and FIGS. 11–19 are sectional views and FIG. 10 is a plan view thereof.

FIGS. 47–52 show respective steps of a self-aligned contact technique of a semiconductor element disclosed in Japanese Patent Laying-Open No. 2001-284452, wherein FIGS. 47, 48 and 50–52 are sectional views thereof, and FIG. 49 is a plan view thereof.

DESCRIPTION OF THE PREFERRED EMBODIMENTS

Embodiments of the present invention will be described with reference to the drawings.

Embodiment 1

Figure 1:
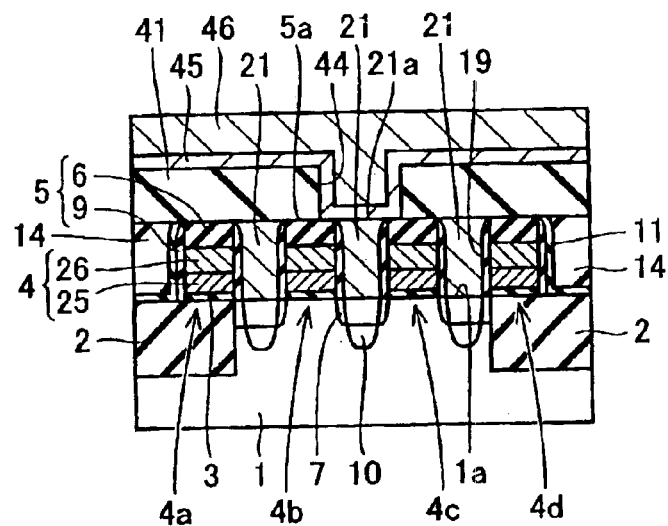
FIG. 1 is a sectional view of a semiconductor device according to a first embodiment of the present invention.

Referring to FIG. 1, a semiconductor device according to a first embodiment of the present invention includes a silicon substrate 1 as a semiconductor substrate with a main surface 1a, an isolation oxide film 2 as an isolation insulation film formed at main surface 1a of silicon substrate 1, gate electrodes 4a and 4d as first gate electrodes formed on isolation oxide film 2, gate electrodes 4b and 4c as second gate electrodes formed on main surface 1a of silicon substrate 1, a gate protection film 5 formed so as to cover gate electrodes 4a, 4b, 4c and 4d, an insulation film 11 extending over from isolation oxide film 2 to the side faces of gate electrodes 4a and 4d, an interlayer insulation film 14 formed so as to cover insulation film 11, and a pad contact 21 formed between respective adjacent gate electrodes 4a, 4b, 4c and 4d.

Top face 21a of pad contact 21 is formed coplanar with top face 5a of gate protection film 5 so that the distance from main surface 1a of silicon substrate 1 to top face 21a of pad contact 21 is not greater than the distance from main surface 1a of silicon substrate 1 to top face 5a of gate protection film 5.

On main surface 1a of silicon substrate 1 are formed a plurality of isolation oxide films 2 spaced apart from each other. A gate electrode 4 is disposed on silicon substrate 1 with a gate insulation film 3 formed of a silicon oxide film therebetween. The thickness of gate insulation film 3 is approximately 2 nm to 10 nm.

Gate electrode 4 is formed by having a conductor film 25 such as a polysilicon and a conductor film 26 such as of a metal film sequentially layered on gate insulation film 3. Conductor films 25 and 26 respectively have a film thickness of approximately 20 nm to 150 nm. On the isolation region which is a region where isolation oxide film 2 is formed on silicon substrate 1, gate electrodes 4a and 4d are disposed. On the active region which is the region where isolation oxide film 2 on silicon substrate 1 is not formed, gate electrodes 4b and 4c are disposed. At main surface 1a of silicon substrate 1 located between adjacent gate electrodes 4, an n type impurity region 7 is formed relatively shallow.

An insulation film 6 such as of a nitride film is formed to a thickness of approximately 20 nm to 100 nm on conductor film 26. A sidewall 9 of a nitride film is formed at both sides of gate electrode 4 and insulation film 6. Insulation film 6 and sidewall 9 constitute gate protection film 5. At main surface 1a of silicon substrate 1 located between adjacent sidewalls 9, an n type impurity region 10 is formed relatively deeply.

Insulation film 11 such as of a nitride film is formed in an extending and covering manner from sidewall 9 located at respective side planes of gate electrode 4a and 4d that do not face gate electrodes 4b and 4c to isolation oxide film 2.

An interlayer insulation film 14 of a silicon oxide film is formed so as to cover insulation film 11. A pad contact hole 19 is formed so as to reach n type impurity regions 7 and 10, between respective gate electrodes 4a, 4b, 4c and 4d. Pad contact hole 19 is formed including sidewall 9. Pad contact hole 19 is filled with a pad contact 21 of polysilicon or amorphous silicon into which phosphorus, arsenic or the like is implanted. Top face 5a of gate protection film 5, top face 21a of pad contact 21, and the top face of interlayer insulation film 14 are coplanar.

An interlayer insulation film 41 of a silicon oxide film is formed so as to cover top face 5a of gate protection film 5, top face 21a of pad contact 21, and the top face of interlayer insulation film 14. A bit line contact hole 44 reaching top face 21a of pad contact 21 located between gate electrodes 4b and 4c is formed in interlayer insulation film 41. Metal films 45 and 46 are sequentially deposited so as to fill bit line contact hole 44 and cover interlayer insulation film 41. By metal films 45 and 46, a bit line of a predetermined configuration is formed.

According to the semiconductor device of the above-described structure, insulation film 11 and interlayer insulation film 14 are located at a region above isolation oxide film 2 of silicon substrate 1 and at the side faces of gate electrodes 4a and 4d. Accordingly, leakage current from gate electrodes 4a and 4d to interlayer insulation film 14 can be prevented. Also, electrically connection between isolation oxide film 2 and interlayer insulation film 14 can be completely prevented.

Pad contact 21 is isolated from gate electrode 4 by gate protection film 5. Therefore, shorting will not be developed between pad contact 21 and gate electrode 4. It is to be noted that top face 21a of pad contact 21 is coplanar with top face 5a of gate protection film 5. Therefore, there is no conductor film on top face 5a of gate protection film 5, and gate protection film 5 is covered with interlayer insulation film 41. Therefore, shorting will not be developed between adjacent pad contacts 21.

A method of fabricating the semiconductor device of FIG. 1 will be described with reference to FIGS. 2–19.

Figure 2:
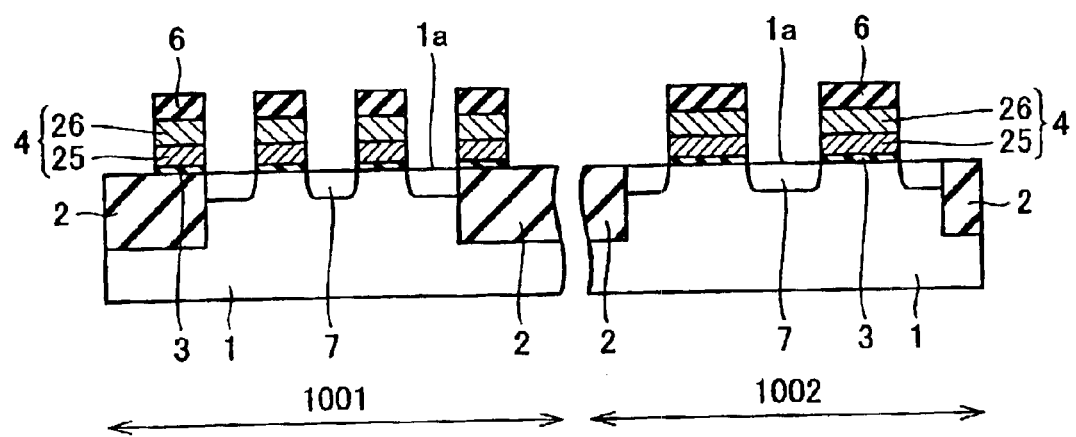

Referring to FIG. 2, a memory cell region 1001 and a peripheral circuit region 1002 are defined on silicon substrate 1. The subsequent fabrication process of the semiconductor device is carried out at the same time in memory cell region 1001 and peripheral circuit region 1002. In the drawings, it is assumed that peripheral circuit region 1002 is the region where an n type transistor is formed.

Isolation oxide film 2 is formed on main surface 1a of silicon substrate 1 by burying a thermal oxide film and an oxide film. The isolation region is formed by isolation oxide film 2. The region excluding this isolation region becomes the active region. Gate insulation film 3 is formed to a thickness of approximately 2 nm to 10 nm. Then, conductor films 25 and 26 corresponding to interconnections are formed.

Gate insulation film 3 is a thermal oxide film or an undoped silicon oxide film deposited by CVD (Chemical Vapor Deposition) under reduced pressure and atmospheric pressure. Conductor film 25 is formed of polysilicon or amorphous silicon into which phosphorus (P), arsenic (As) or boron (B) is doped. Conductor film 26 is formed of a refractory metal film such as of titanium nitride (TiN) or tungsten (W), or a silicide film thereof Insulation film 6 directed to protecting the interconnection is formed on conductor film 26. Insulation film 6 is formed of a nitride film or a nitrided oxide film, a layered film thereof, or a double layered film of an oxide film and a nitride film. These films have a selectivity of at least a predetermined level when dry etching such as RIE (Reactive Ion Etching) is applied on the oxide film.

Using a resist film having a predetermined opening pattern as a mask, dry etching such as RIE is applied to insulation film 6 to give a predetermined pattern. Using insulation film 6 as a mask, dry etching such as a RIE is applied to conductor films 25 and 26 to form gate electrode 4 of a predetermined configuration. It is to be noted that the etching applied to conductor films 25 and 26 has a selectivity of at least a predetermined level to the oxide film. Therefore, the etching process will terminate in the course of removing gate insulation film 3 to leave a portion of gate insulation film 3.

Using insulation film 6 formed on gate electrode 4 as a mask, impurities such as phosphorus or arsenic are implanted at the dosage of $1\times10^{13}/cm^2$ to $1\times10^{14}/cm^2$ to main surface 1a of silicon substrate 1 to form n type impurity region 7. Then, thermal oxidation is generally carried out to cover the interconnection and substrate with a thermal oxide film.

Figure 3:
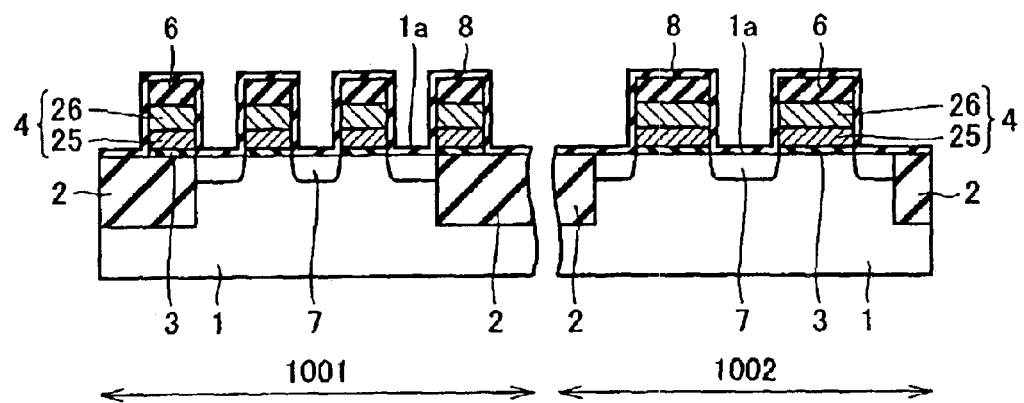

Referring to FIG. 3, an insulation film 8 directed to protecting the sidewall of the interconnection is formed so as to cover silicon substrate 1, both side faces of gate electrode 4 and insulation film 6, and the top face of insulation film 6. Insulation film 8 is a nitride film or nitrided oxide film having a selectivity of at least a predetermined level to the oxide film when dry etching such as RIE is applied. Insulation film 8 is formed to a thickness of 10 nm to 100 nm.

Figure 4:
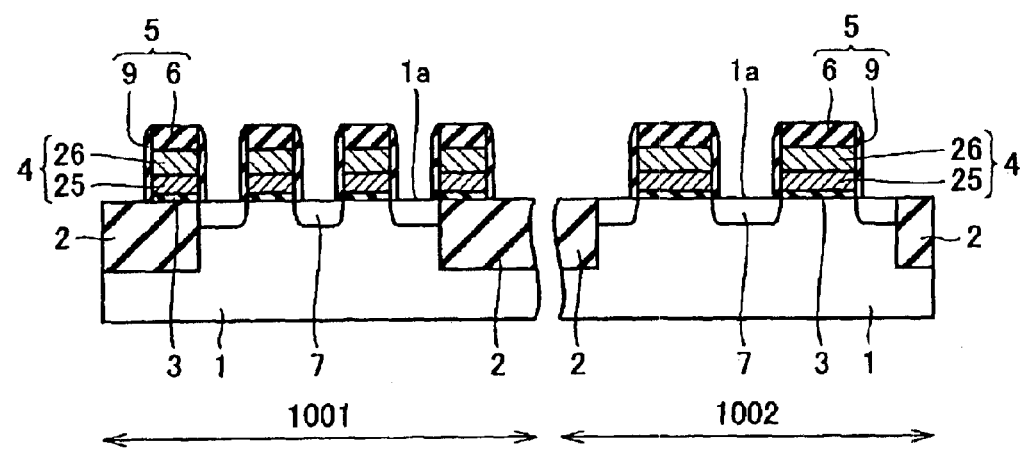

Referring to FIG. 4, the entire surface of insulation film 8 is subjected to dry etching, whereby sidewall 9 is formed at both side faces of gate electrode 4 and insulation film 6. Since the etching carried out on insulation film 8 has a selectivity of at least a predetermined level to the oxide film, the etching process will terminate in the course of removing gate insulation film 3. As a result, gate insulation film 3 will remain. This sidewall 9 and insulation film 6 constitute gate protection film 5.

Figure 5:
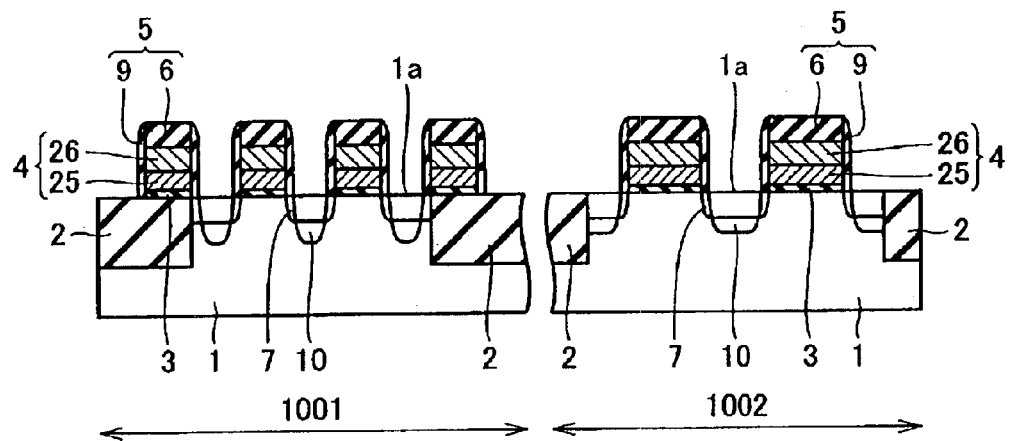

Referring to FIG. 5, using insulation film 6 and sidewall 9 as a mask, impurities such as phosphorus or arsenic are implanted at the dosage of $1\times10^{13}/cm^2$ to $1\times10^{14}/cm^2$ to main surface 1a of silicon substrate 1 to form n type impurity region 10. At this stage, n type impurity region 10 is formed so as to be located deeper than n type impurity region 7. This provides the advantage of alleviating junction at memory cell region 1001 as well as suppressing the transistor short channel effect.

Figure 6:
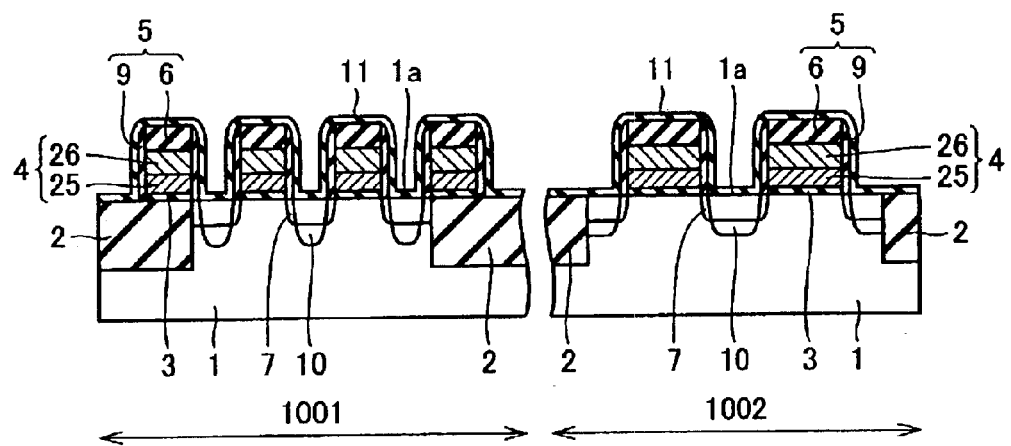

Referring to FIG. 6, insulation film 11 is formed so as to cover silicon substrate 1, sidewall 9 and insulation film 6. Insulation film 11 is a nitride film or nitrided oxide film having a selectivity of at least a predetermined level to the oxide film when dry etching such as RIE is applied. Insulation film 11 is disposed for the purpose of protecting isolation oxide film 2 formed at main surface 1a of silicon substrate 1. In a subsequent step, an opening may be formed in the interlayer insulation film above the isolation region. Insulation film 11 serves to prevent isolation oxide film 2 from being etched during this step.

Figure 7:
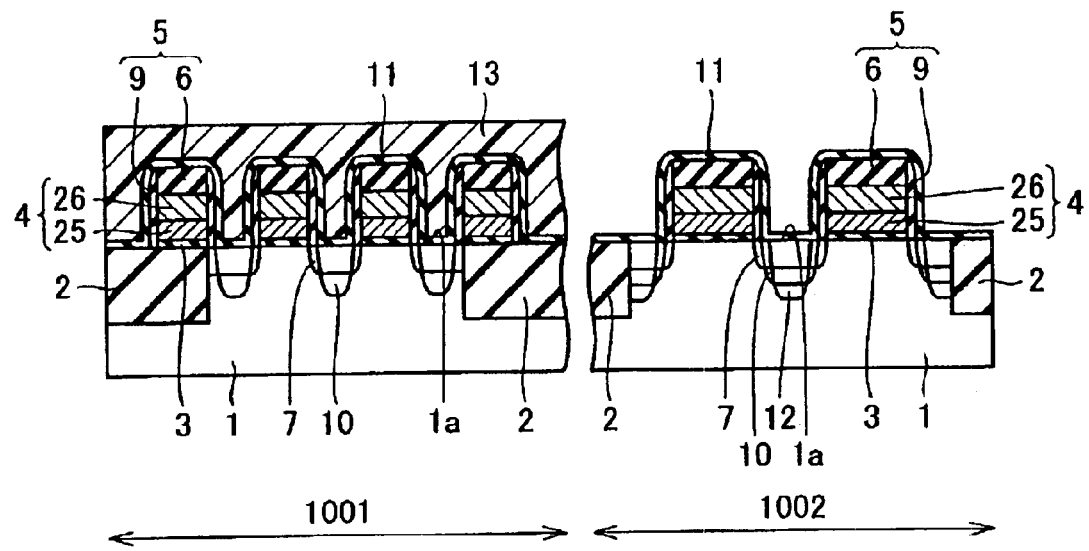

Referring to FIG. 7, resist film 13 is formed so as to cover insulation film 11 at the entire region of memory cell region 1001. In peripheral circuit region 1002, impurities such as phosphorus or arsenic are implanted at the dosage of $1 \times 10^{14}/cm^2$ to $1 \times 10^{15}/cm^2$ to main surface 1a of silicon substrate 1 using insulation film 6, sidewall 9 and insulation film 11 as a mask to form n type impurity region 12. At this stage, n type impurity region 12 is formed so as to be located deeper than n type impurity region 10. Then, resist film 13 is removed.

Figure 8:
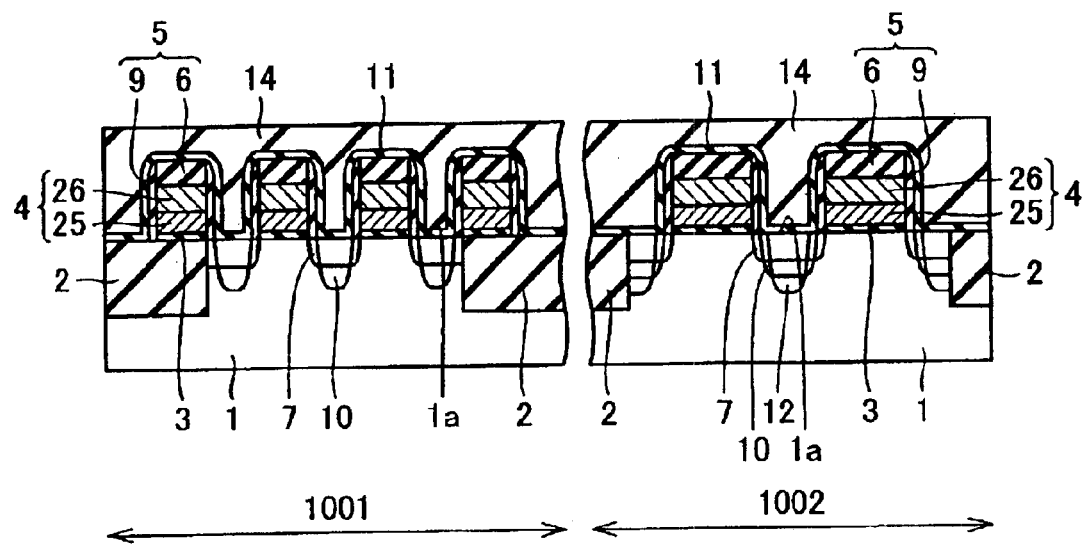

Referring to FIG. 8, interlayer insulation film 14 is formed to a thickness of 300 nm to 1000 nm so as to cover insulation film 11. Interlayer insulation film 14 is formed of a silicon oxide film (PBTEOS) doped with phosphorus and boron, or a silicon oxide film (PTEOS) doped with phosphorus in view of the superiority in the step coverage and planarization. For the purpose of improving the step coverage between interconnections and the planarization at the stepped portion, interlayer insulation film 14 is subjected to heat treatment.

Figure 9:
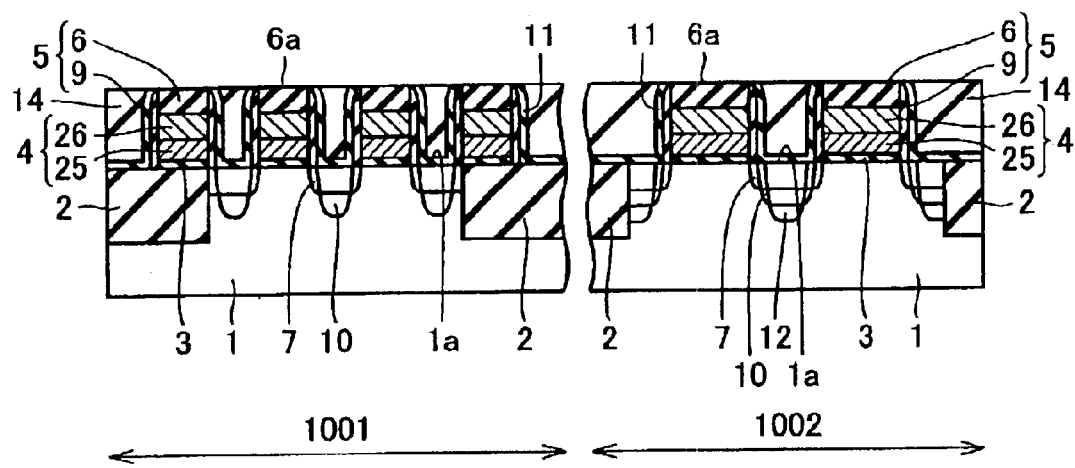

Referring to FIG. 9, interlayer insulation film 14 is polished until top face 6a of insulation film 6 is exposed by means of chemical mechanical polishing (CMP). In the present invention, top face 6a of insulation film 6 does not imply only the top face of insulation film 6 formed at the fabrication step shown in FIG. 2. Top face 6a of insulation film 6 is formed as the plane to be polished in this polishing step, and only exposure of this plane 6a is required.

Figure 10:
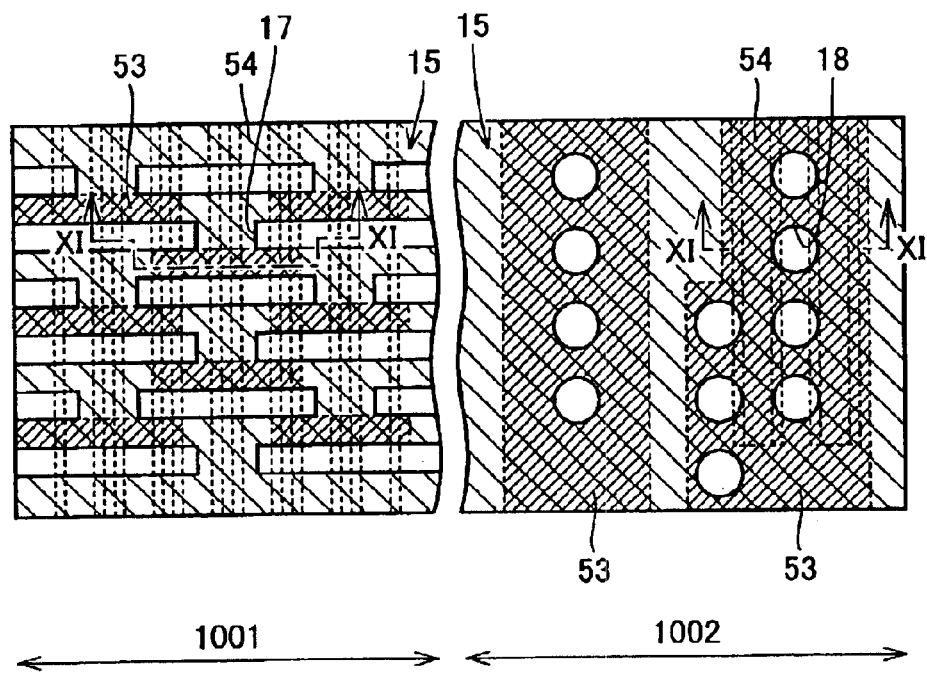
Figure 11:
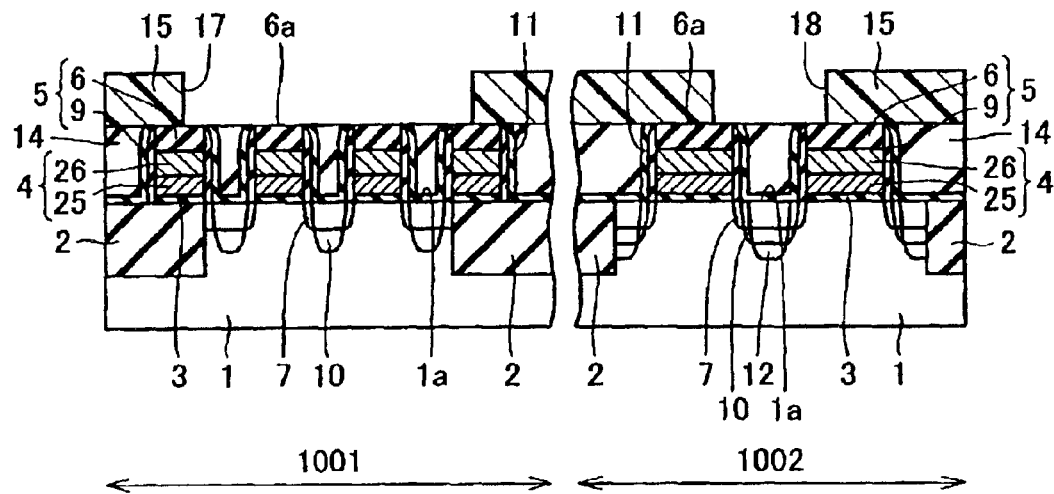

Referring to FIG. 10, the cross section taken along line XI—XI in memory cell region 1001 and peripheral circuit region 1002 corresponds to the cross section shown in FIG. 11. On silicon substrate 1, active region 53, and gate interconnection 54 formed of gate electrode 4 and sidewall 9 are disposed.

Referring to FIGS. 10 and 11, resist film 15 having an opening of a predetermined pattern is formed so as to cover the top face of the polished interlayer insulation film 14 and insulation film 6. In memory cell region 1001, resist film 15 has a bar-shaped opening 17 formed so as tranverse over a plurality of impurity regions. In peripheral circuit region 1002, a hole-shape opening 18 is formed so as to extend over the impurity regions.

Figure 12:
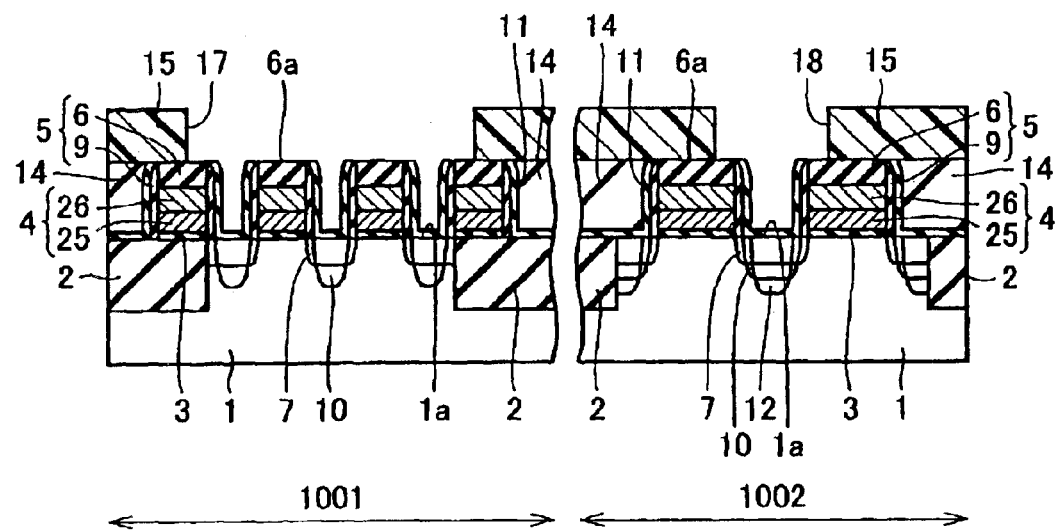

Referring to FIG. 12, dry etching such as RIE is applied to interlayer insulation film 14 with resist film 15 as a mask. Since the etching applied to interlayer insulation film 14 that is an oxide film has a selectivity of at least a predetermined level to the nitride film, the etching process can be terminated in the course of removing insulation films 6 and 11 formed of nitride. Since a bar shape, not a hole shape, opening 17 of a large dimension is formed in resist film 15 in memory cell region 1001, the etching selectivity can be increased. Therefore, etching can be conducted in a desired manner even if the distance between gate interconnections is reduced due to microminiaturization of memory cells.

Figure 13:
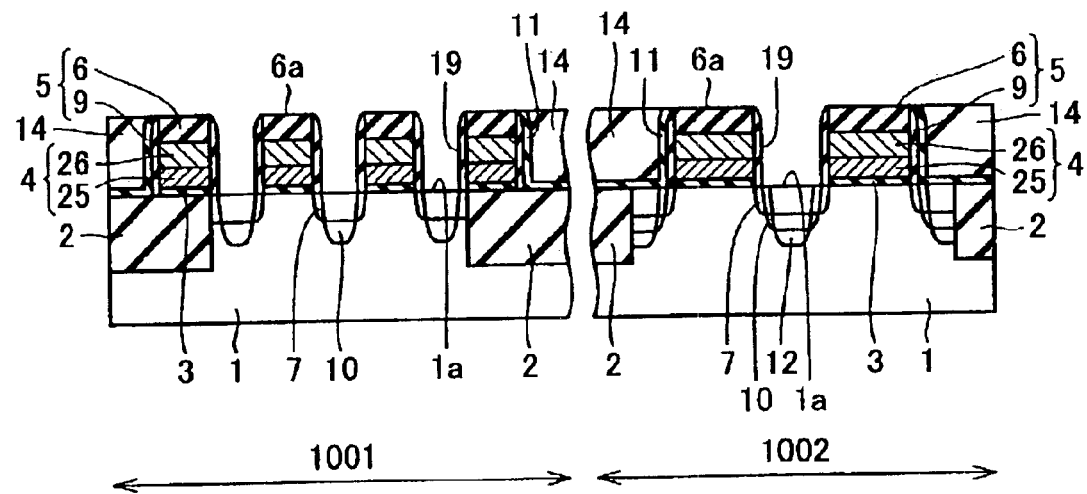

Referring to FIG. 13, following removal of resist film 15, insulation film 11 is subjected to dry etching such as RIE to be completely removed. Between adjacent gate electrodes 4, a pad contact hole 19 having sidewall 9 as the sidewall and reaching the impurity region of silicon substrate 1 is formed.

Figure 14:
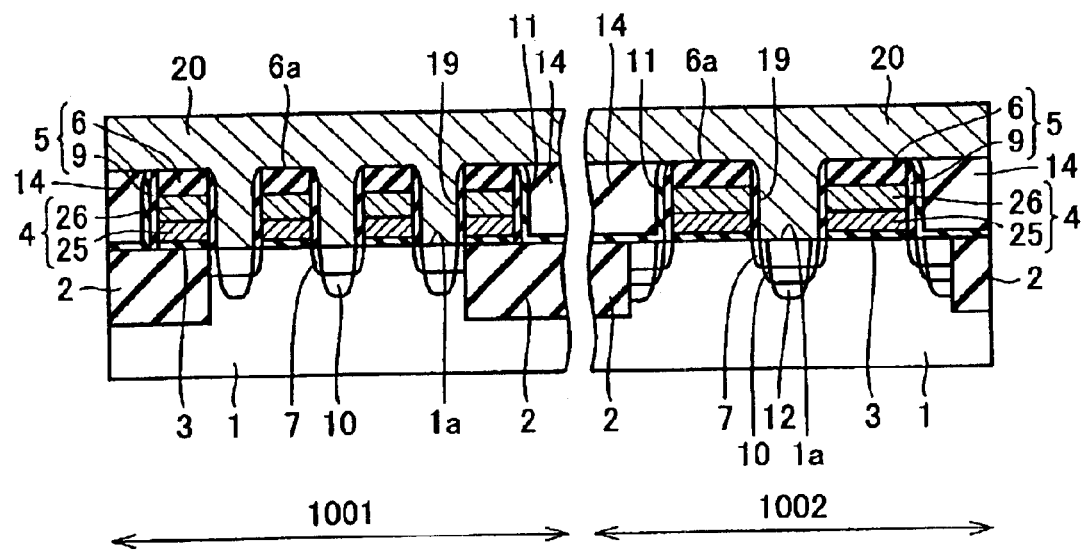

Referring to FIG. 14, conductor film 20 is deposited by CVD so as to fill pad contact hole 19 and cover interlayer insulation film 14 and insulation film 6. Conductor film 20 is formed of polysilicon or amorphous silicon doped with phosphorus or arsenic, and has a film thickness of approximately 100 nm to 400 nm.

Figure 15:
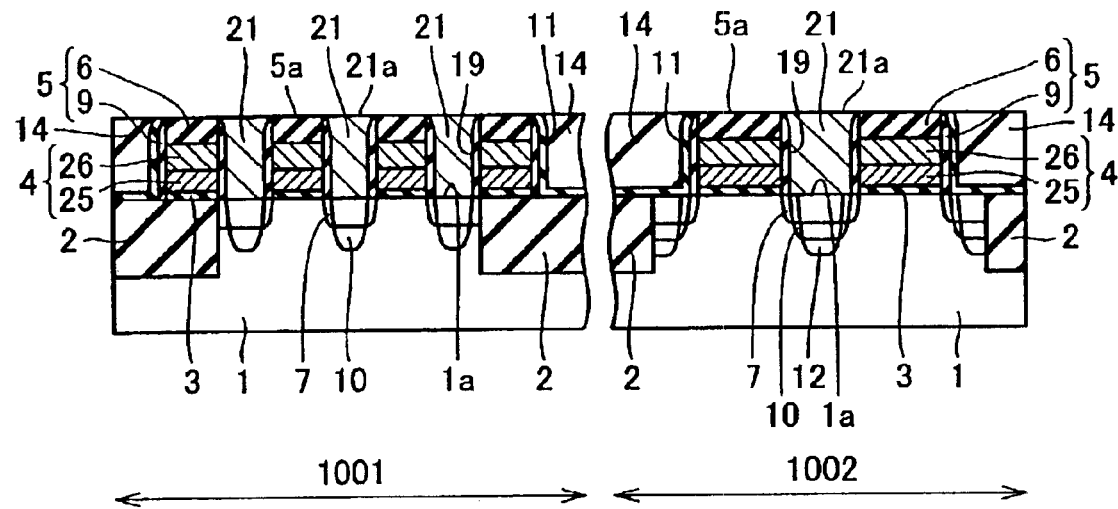

Referring to FIG. 15, conductor film 20 is polished by chemical mechanical polishing until top face 5a of gate protection film 5 is obtained. In other words, the polishing step of conductor film 20 is terminated between top face 6a and the bottom of insulation film 6 so that a portion of insulation film 6 remains. Thus, pad contact 21 is formed in pad contact hole 19. By the present fabrication step, no conductor film 20 will remain on top face 5a of gate protection film 5. Shorting between adjacent pad contacts 21 will not be developed.

Figure 16:
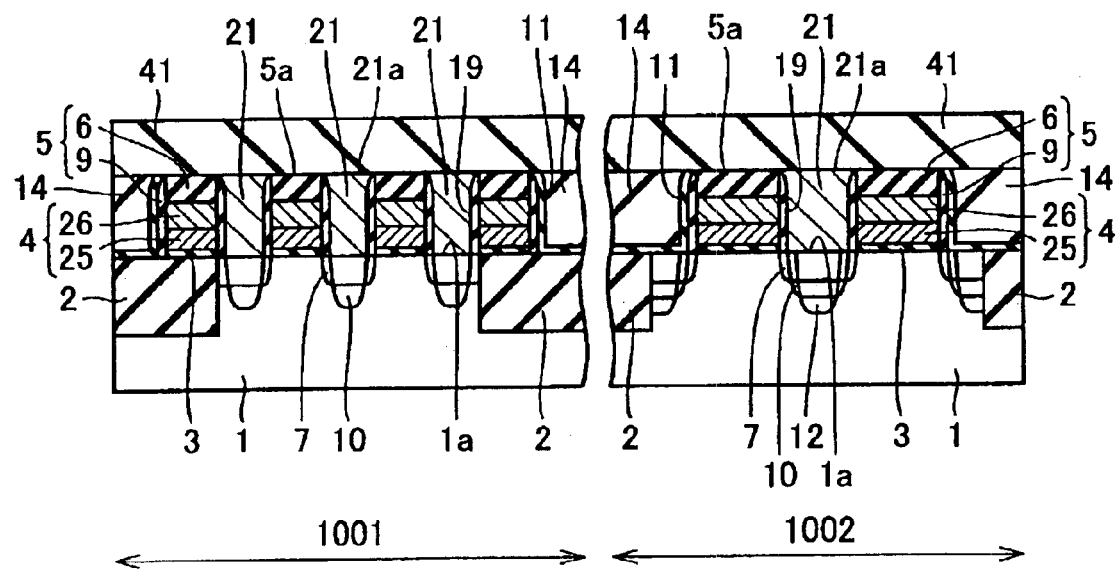

Referring to FIG. 16, interlayer insulation film 41 which is a silicon oxide film is formed to a thickness of 50 nm to 500 nm so as to cover interlayer insulation film 14, pad contact 21 and insulation film 6. Interlayer insulation film 41 is a silicon oxide film doped, or not doped with phosphorus and boron, deposited through CVD in reduced pressure and atmospheric pressure.

Figure 17:
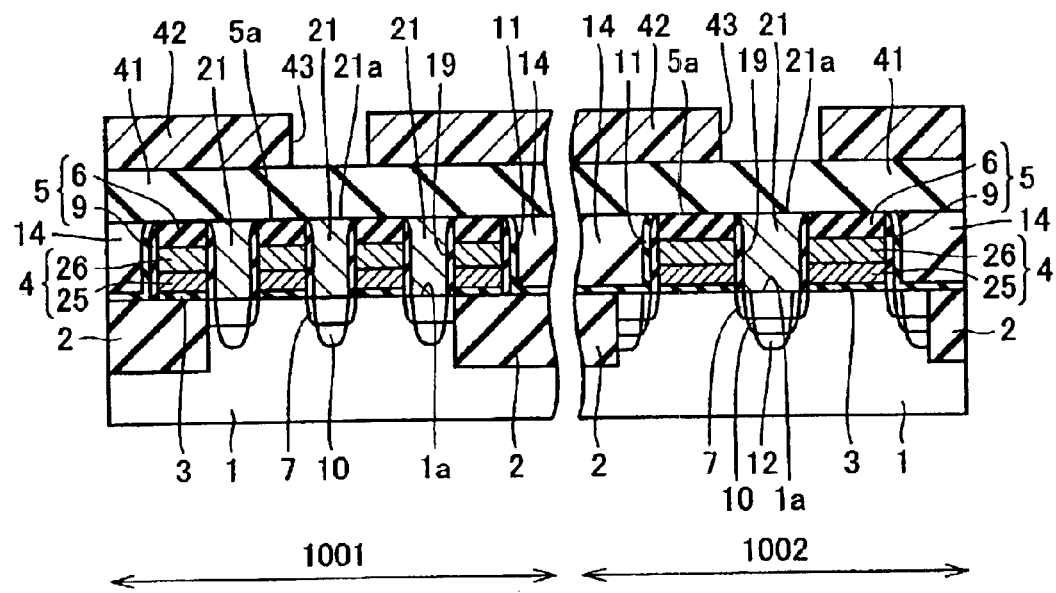

Referring to FIG. 17, a resist film 42 with an opening 43 located corresponding to the formation of a bit line contact is disposed on interlayer insulation film 41.

Figure 18:
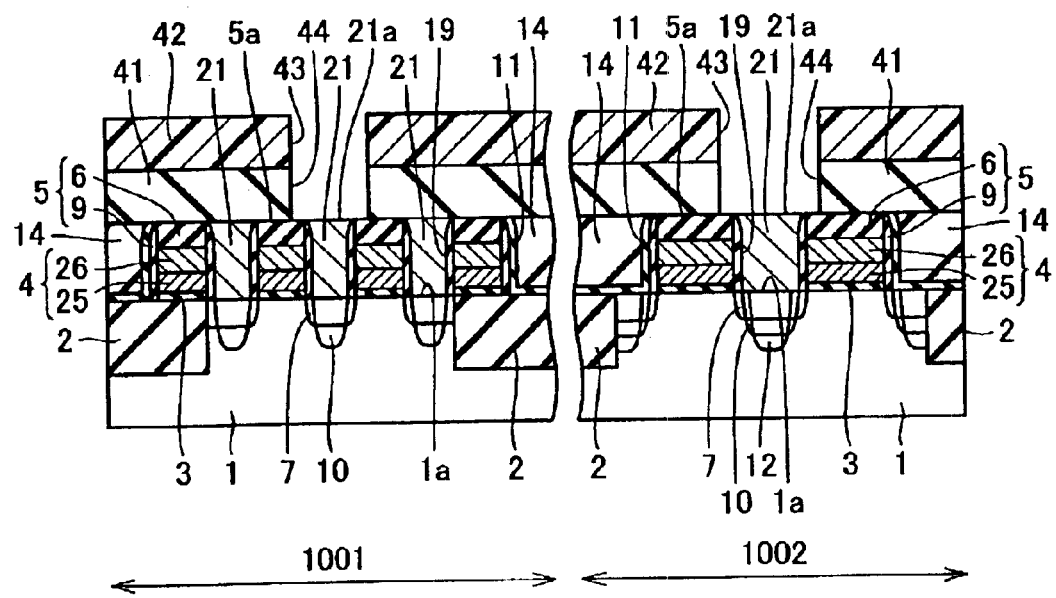

Referring to FIG. 18, interlayer insulation film 41 is subjected to dry etching such as RIE with resist film 42 as a mask to form bit line contact hole 44.

Figure 19:
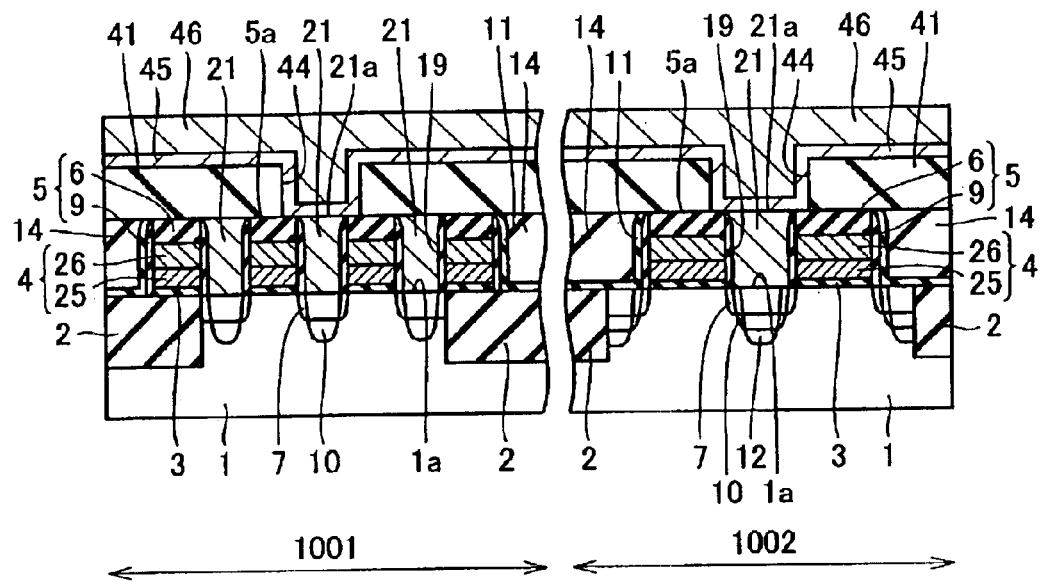

Referring to FIG. 19, metal films 45 and 46 are sequentially deposited so as to fill bit line contact hole 44 and cover interlayer insulation film 41. Metal film 45 is formed of titanium (Ti) or titanium nitride (TiN), and has a film thickness of approximately 20 nm to 100 nm. Metal film 46 is formed of a silicide film of a refractory metal such as tungsten (W), a stacked film thereof, or a conductive metal film such as of tungsten (W) or aluminum (Al), and has a thickness of approximately 50 nm to 200 nm. Then, a resist pattern having an opening of a predetermined pattern is formed. Using this resist film as a mask, metal films 45 and 46 are subjected to dry etching such as RIE to form a bit line of a desired configuration.

The semiconductor device fabrication method according to the first embodiment of the present invention includes the steps of: forming, on main surface 1a of silicon substrate 1 that is a semiconductor substrate including a memory cell region 1001 and peripheral cell region 1002 defined in plane, a plurality of gate electrodes 4 in memory cell region 1001; forming gate protection film 5 covering the top face and side face of gate electrode 4; forming n type impurity regions 7 and 10 as the impurity region of the first conductivity type at main surface 1a of silicon substrate 1 located at both sides of gate electrode 4; forming interlayer insulation film 14 so as to cover silicon substrate 1 and gate protection film 5, and more readily etched than gate protection film 5 when a predetermined etchant is used; removing interlayer insulation film 14 until top face 6a of insulation film 6 corresponding to the top face of gate protection film 5 is exposed; forming on interlayer insulation film 14 resist mask 15 as a mask film having an opening 17 that exposes partially the exposed gate protection film 5; etching interlayer insulation film 14 and gate protection film 5 using a predetermined etchant with resist film 15 as a mask to form pad contact hole 19 that is a hole reaching impurity regions 7 and 10 and that has at least a portion of the side face of the hole formed of gate protection film 5; forming conductor film 20 so as to fill pad contact hole 19 and cover interlayer insulation film 14; and forming pad contact 21 in pad contact hole 19 by leaving a portion of conductor film 20 in pad contact hole 19 and removing other portions of conductor film 20.

The step of forming gate electrode 4 includes the step of forming a plurality of gate electrodes 4 in peripheral circuit region 1002 on main surface 1a of silicon substrate 1. The step of forming gate protection film 5 includes the step of forming gate protection film 5 covering the top face and side face of gate electrode 4 formed in peripheral circuit region 1002. The step of forming n type impurity regions 7 and 10 includes the step of forming n type impurity regions 7, 10 and 12 as the impurity regions of the first conductivity type at main surface 1a of silicon substrate 1 located at both sides of gate electrode 4 formed in peripheral circuit region 1002. The step of forming interlayer insulation film 14 includes the step of forming interlayer insulation film 14 so as to cover silicon substrate 1 and gate protection film 5 formed in peripheral circuit region 1002. The step of removing interlayer insulation film 14 includes the step of removing interlayer insulation film 14 until top face 6a of insulation film 6 formed in peripheral circuit region 1002 is exposed. The step of forming resist film 15 includes the step of forming on interlayer insulation film 14 resist film 15 having an opening 18 that exposes the exposed gate protection film 5 partially, on peripheral circuit region 1002. The step of forming pad contact hole 19 includes the step of etching interlayer insulation film 14 and gate protection film 5 located in peripheral circuit region 1002 using a predetermined etchant with resist film 15 as a mask to form pad contact hole 19 reaching impurity regions 7, 10 and 12. The step of forming conductor film 20 includes the step of forming conductor film 20 so as to fill pad contact hole 19 located in peripheral circuit region 1002 and cover interlayer insulation film 14. The step of forming pad contact 21 includes the step of forming pad contact 21 in pad contact hole 19 by leaving a portion of conductive film 20 in pad contact hole 19 located in peripheral circuit region 1002 and removing other portions of connector film 20.

In the step of removing interlayer insulation film 14, interlayer insulation film 14 is removed by chemical mechanical polishing. In the step of forming pad contact 21, conductor 20 is removed by chemical mechanical polishing.

According to the above-described semiconductor device fabrication method, interlayer insulation film 14 is polished until top face 6a of insulation film 6 is exposed prior to formation of conductor film 20. Following the polishing step, the polished face of interlayer insulation film 14 is provided in planarization. By disposing conductor film 20 on the polished face, planarization of conductor film 20 can be improved. It is therefore not necessary to take into account the film thickness of interlayer insulation film 14 in the step of polishing conductor film 20 down to a predetermined position. Thus, the problem of conductor film 20 not being polished down to a predetermined position so as to remain on interlayer insulation film 14, causing short circuiting between adjacent pad contacts 21, can be overcome.

Furthermore, the problem of conductor film 20 being over etched to completely remove insulation film 6 on the top face of gate electrode 4 to result in exposure of gate electrode 4 can be overcome. Thus, short-circuiting between gate electrode 4 and pad contact 21 will not occur. The polishing step of interlayer insulation film 14 by chemical mechanical polishing is advantageous in that no recesses will be formed at top face 6a of insulation film 6. If a recess is formed, conductor film 20 will remain in this recess to cause shorting between adjacent pad contacts 21. The fabrication step of removing conductor film 20 by chemical mechanical polishing is advantageous in that conductor film 20 can be removed so as not to remain on the top face of gate protection film 5, and removed down only to an appropriate position so that the gate protection film 5 is not completely removed.

In view of the shorter distance between gate electrodes directed to microminiaturization of memory cells, pad contact hole 19 cannot be made so deep in order to improve the step coverage between interconnections. This means that the height of insulation film 6 is limited. Therefore, a semiconductor fabrication method that includes a step of removing conductor film 20 down to a predetermined position of insulation film 6 is beneficial to not having to take into account the thickness of the film formed on insulation film 6.

In parallel to the fabrication step of a semiconductor device having an n type impurity region in memory cell region 1001 of silicon substrate 1, a semiconductor device having an n type impurity region in peripheral circuit region 1002 is fabricated at the same time. Therefore, the number of fabrication steps of the semiconductor device can be reduced.

Second Embodiment

A semiconductor device fabrication method according to a second embodiment of the present invention includes the steps shown in FIGS. 20–25, following the fabrication step of the semiconductor device fabrication method of the first embodiment shown in FIGS. 2–9. The semiconductor device fabrication method of the second embodiment further includes the steps shown in FIGS. 16–19 of the first embodiment after the steps of FIGS. 20–25. In the second embodiment, description of the same fabrication steps will not be repeated.

Figure 20:
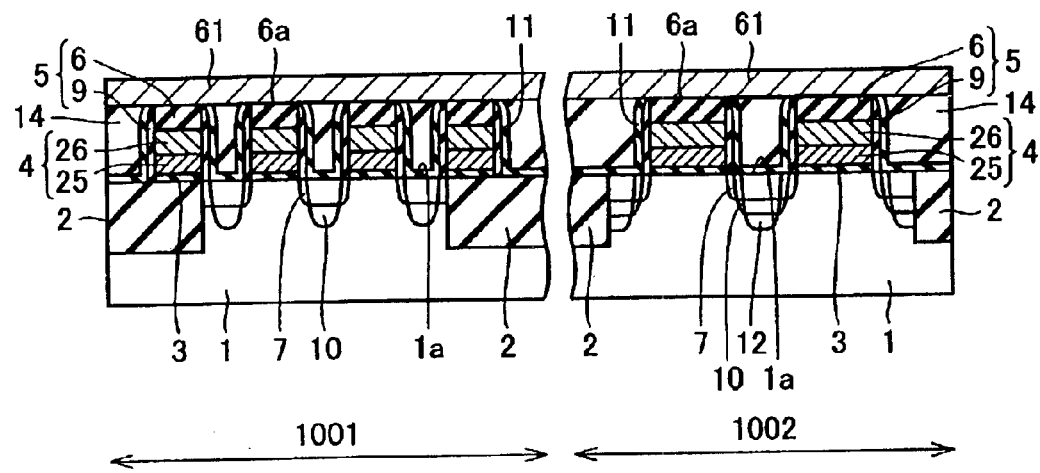
FIGS. 20–25 are sectional views of the semiconductor device of FIG. 1 showing respective steps of a fabrication method according to a second embodiment of the present invention.

Referring to FIG. 20, a silicon oxide film 61 is formed to a thickness of 50 nm to 150 nm so as to cover interlayer insulation film 14 and insulation film 6. Silicon oxide film 61 is a silicon oxide film deposited by CVD in reduced pressure and atmospheric pressure, doped or not doped with phosphorus and boron.

Figure 21:
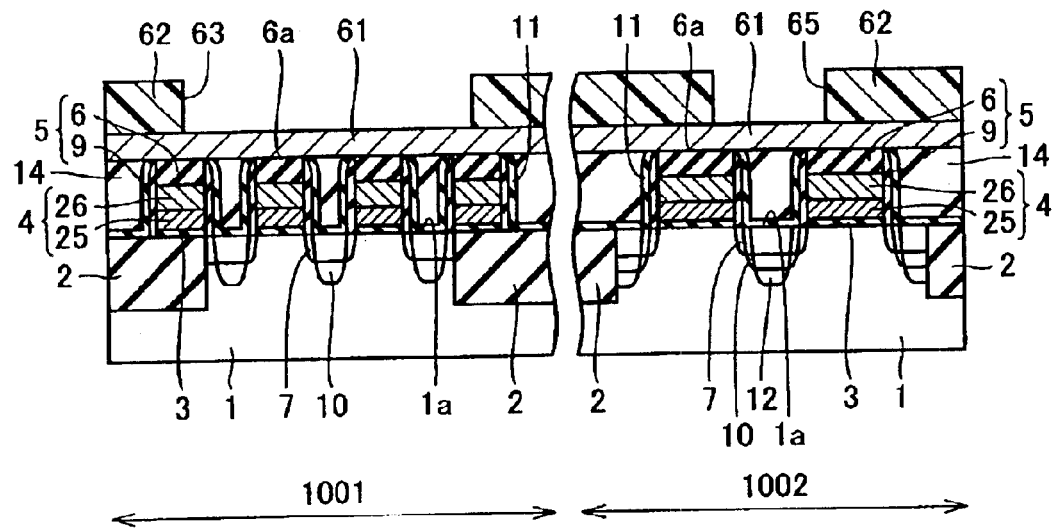

Referring to FIG. 21, a resist film 62 having a bar-shape opening 63 in memory cell region 1001 and a hole-shape opening 65 in peripheral circuit region 1002 is formed on silicon oxide film 61. The opening patterns of openings 63 and 65 in resist film 62 are identical to the patterns of openings 17 and 18 in resist film 15 shown in FIGS. 10 and 11 of the first embodiment.

Figure 22:
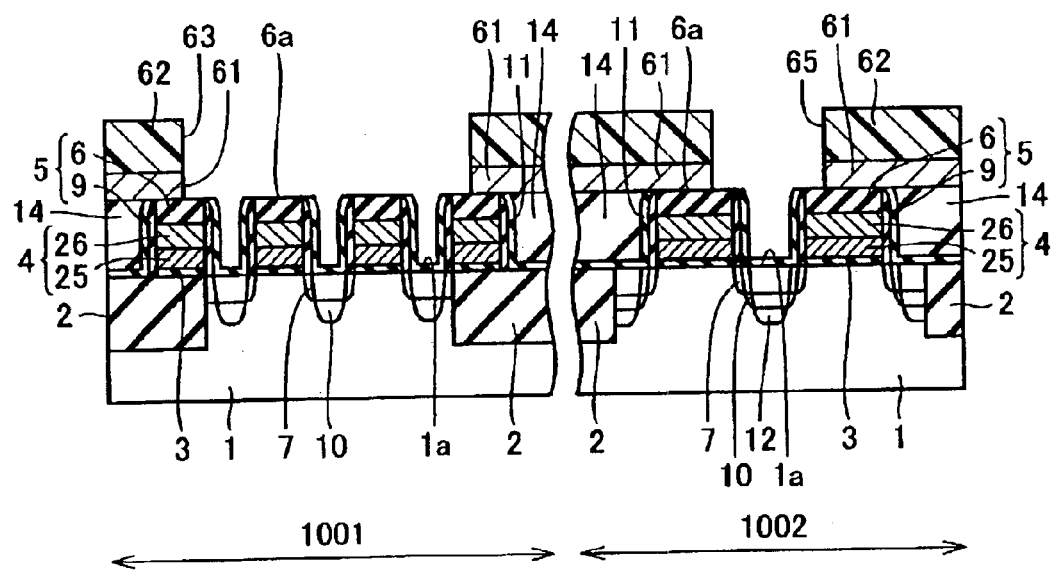

Referring to FIG. 22, silicon oxide film 61 and interlayer insulation film 14 are subjected to dry etching such as RIE with resist film 62 as a mask. The etching carried out on interlayer insulation film 14 which is an oxide film and to silicon oxide film 61 has a selectivity of at least predetermined level with respect to the nitride film. Therefore, the etching step can be terminated during the course of removing insulation films 6 and 11 which are nitride films.

Figure 23:
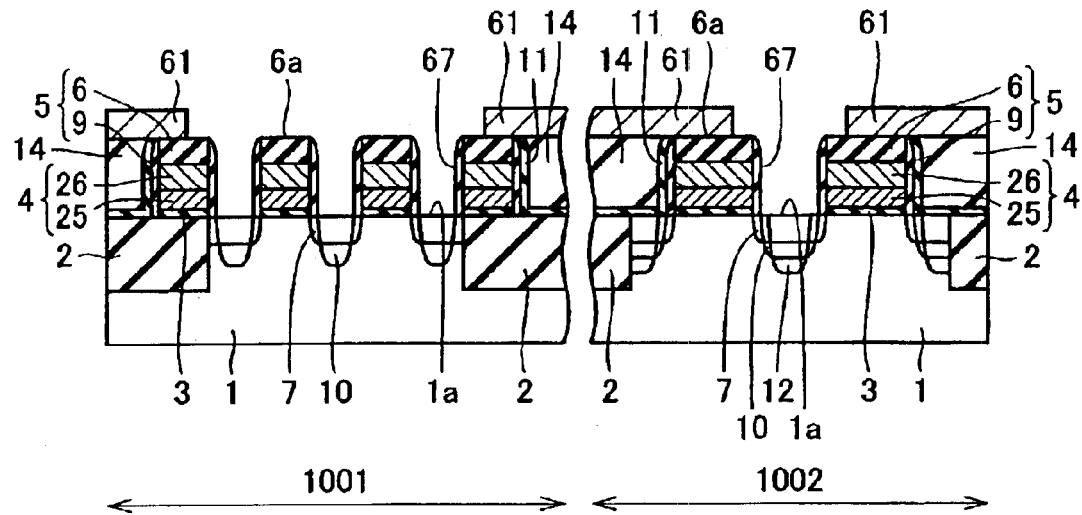

Referring to FIG. 23, following removal of resist film 62, insulation film 11 is subjected to dry etching such as RIE to remove any remaining insulation film 11. Between adjacent gate electrodes 4, a pad contact hole 67 having sidewall 9 as the sidewall and reaching the impurity region of silicon substrate 1 is formed.

Figure 24:
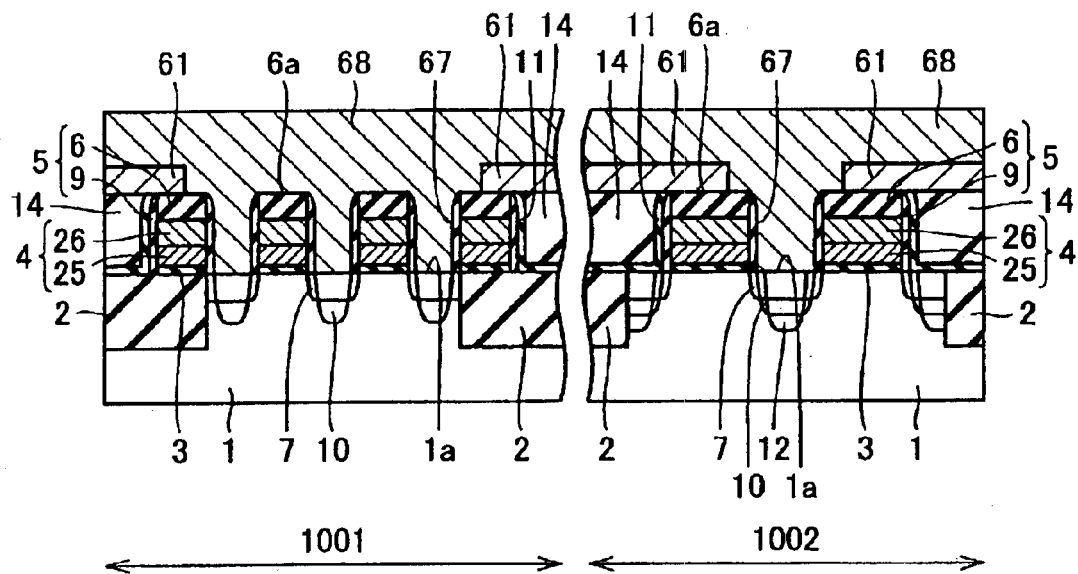

Referring to FIG. 24, conductor film 68 is deposited by CVD so as to fill pad contact hole 67 and cover insulation film 6 and silicon oxide film 61. Conductor film 68 is formed of polysilicon or amorphous silicon doped with phosphorous or arsenic, and has a film thickness of approximately 100 nm to 400 nm.

Figure 25:
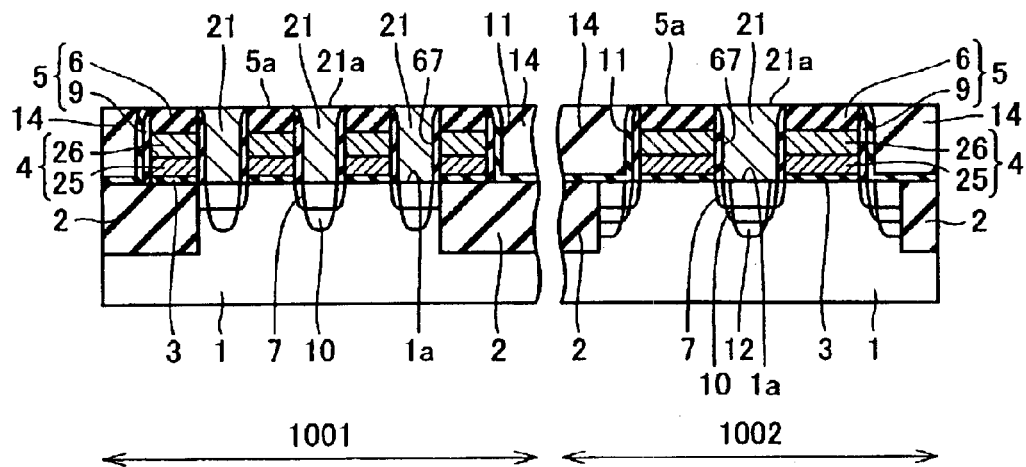

Referring to FIG. 25, conductor film 68 is polished by chemical mechanical polishing until top face 5a of gate protection film 5 appears. In other words, the polishing process of conductor film 68 is terminated between top face 6a and the bottom of insulation film 6 so that insulation film 6 remains. In this step, silicon oxide film 61 is also polished at the same time. This is due to the mechanical effect of chemical mechanical polishing. Thus, pad contact 21 is formed in pad contact hole 67. Then, the fabrication method proceeds to the step of FIG. 16 of the first embodiment.

The semiconductor device fabrication method of the second embodiment further includes the step of forming on interlayer insulation film 14 a silicon oxide film 61 that is an insulation film of a material identical to that of interlayer insulation film 14, prior to the formation of resist film 62 that is a mask film. The step of forming resist film 62 includes the step of forming resist film 62 on silicon oxide film 61.

According to the above-described semiconductor device fabrication method, the advantages of the first embodiment can be achieved. It is to be noted that, in the second embodiment, silicon oxide film 61 is formed on gate protection film 5 in the fabrication step of etching interlayer insulation film 14 and silicon oxide film 61 with resist film 62 as a mask. By conducting the etching step so that gate protection film 5 is not exposed at the initial stage and eventually exposed during the course of etching, the etching amount of gate protection film 5 covering gate electrode 4 can be controlled. Thus, the problem of shorting between gate electrode 4 and pad contact 21 can be prevented. In the polishing step of conductor film 68 to form pad contact 21, variation in the film thickness does not have to be taken into account since a thinner silicon oxide film 61 is to be polished as compared to the case where a thick interlayer insulation film 14 is to be polished.

Different etching rates can be achieved between interlayer insulation film 14 and silicon oxide film 61 by altering the dosage of the phosphorus and boron implanted into interlayer insulation film 14 and silicon oxide film 61. Therefore, by selecting a predetermined slurry in the step of polishing conductor film 68 in order to form pad contact 21, interlayer insulation film 14 located between gate electrodes can be made more difficult to be etched. Therefore, a recess will not be formed at the top surface of interlayer insulation film 14. Thus, photolithography can be conducted with favorable accuracy on interlayer insulation film 14 at a subsequent step.

Third Embodiment

The semiconductor device fabrication method of the third embodiment includes the steps of FIGS. 2–9 corresponding to the first embodiment, and then the steps of FIGS. 26–32. The semiconductor device fabrication method of the third embodiment further includes the steps of FIGS. 16–19 corresponding to the first embodiment after the steps of FIGS. 26–32. Description of the same fabrication step will not be repeated.

Figure 26:
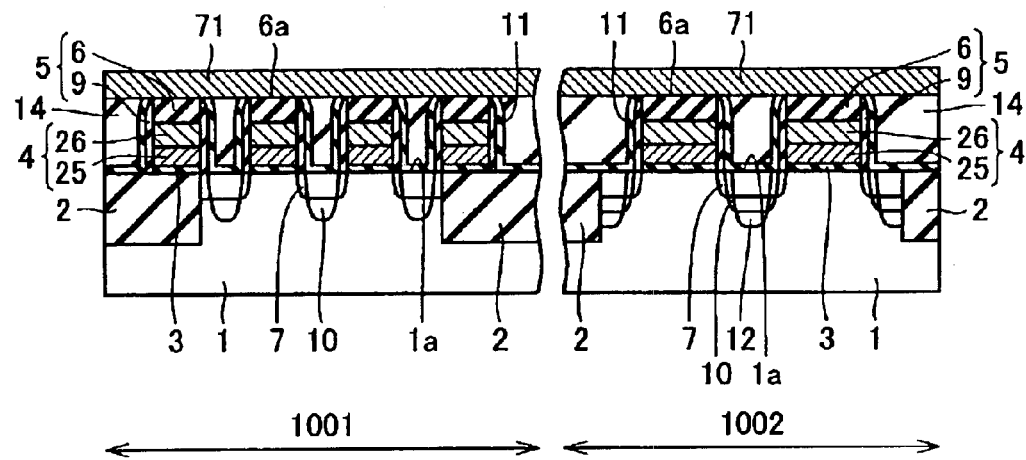
FIGS. 26–32 are sectional views of the semiconductor device of FIG. 1 showing respective steps of a fabrication method according to a third embodiment of the present invention.

Referring to FIG. 26, a silicon film 71 is formed to the thickness of 50 nm to 200 nm so as to cover interlayer insulation film 14 and insulation film 6. Silicon film 71 is formed of polysilicon or amorphous silicon, deposited by CVD and doped with phosphorus and arsenic.

Figure 27:
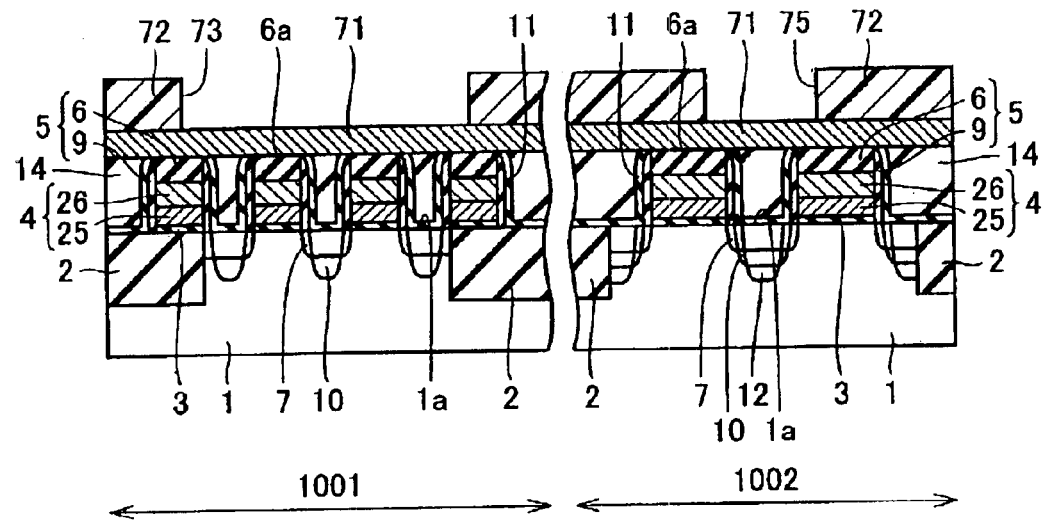

Referring to FIG. 27, a resist film 72 having a bar-shape opening 73 in memory cell region 1001 and a hole-shape opening 75 in peripheral circuit region 1002 is formed on silicon film 71. The patterns of openings 73 and 75 in resist film 72 are identical to the pattern of openings 17 and 18 in resist film 15 shown in FIGS. 10 and 11.

Figure 28:
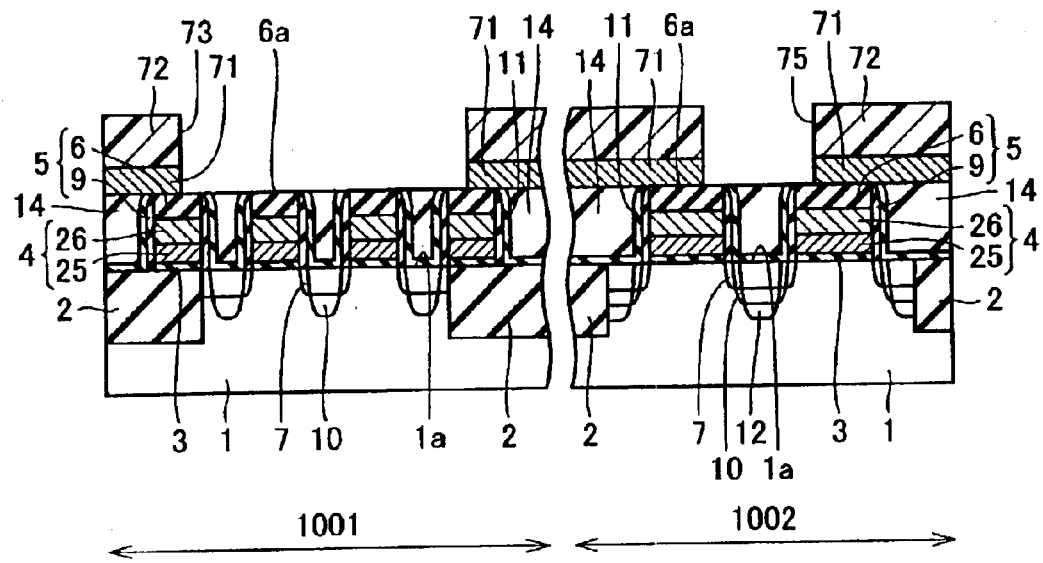

Referring to FIG. 28, silicon film 71 is subjected to dry etching such as RIE using resist film 72 as a mask. The etching carried out on silicon film 71 has a selectivity of at least a predetermined level to the nitride film and oxide film. Therefore, the etching step is terminated at the top face of insulation film 6 and interlayer insulation film 14.

Figure 29:
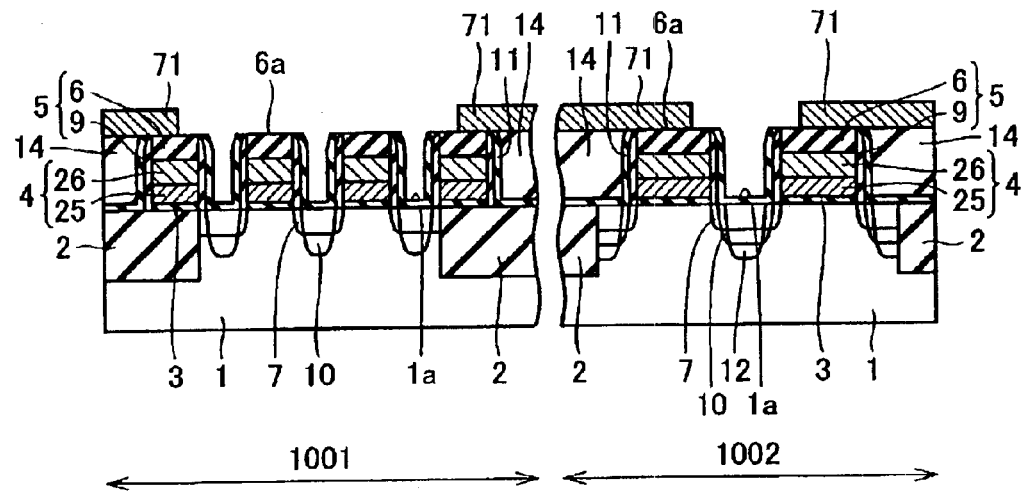

Referring to FIG. 29, following removal of resist film 72, interlayer insulation film 14 is subjected to dry etching such as RIE with silicon film 71 as a mask. The etching carried out on interlayer insulation film 14 that is an oxide film has a selectivity of at least predetermined level to the nitride film. Therefore, etching can be terminated in the course of removing insulation films 6 and 11.

Figure 30:
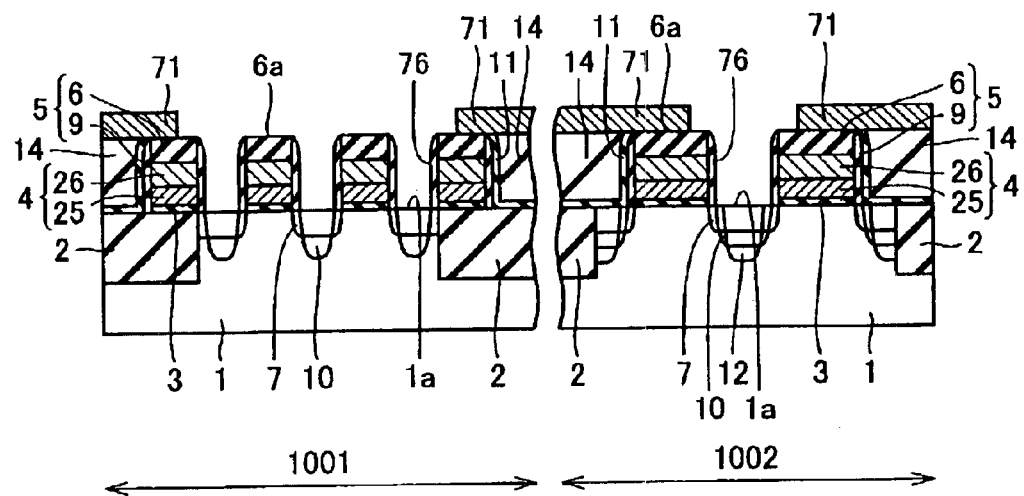

Referring to FIG. 30, insulation film 11 is subjected to dry etching such as RIE to remove any remaining insulation film 11. Between adjacent gate electrodes 4, pad contact hole 76 having sidewall 9 as the side and reaching the impurity region of silicon substrate 1 is formed.

Figure 31:
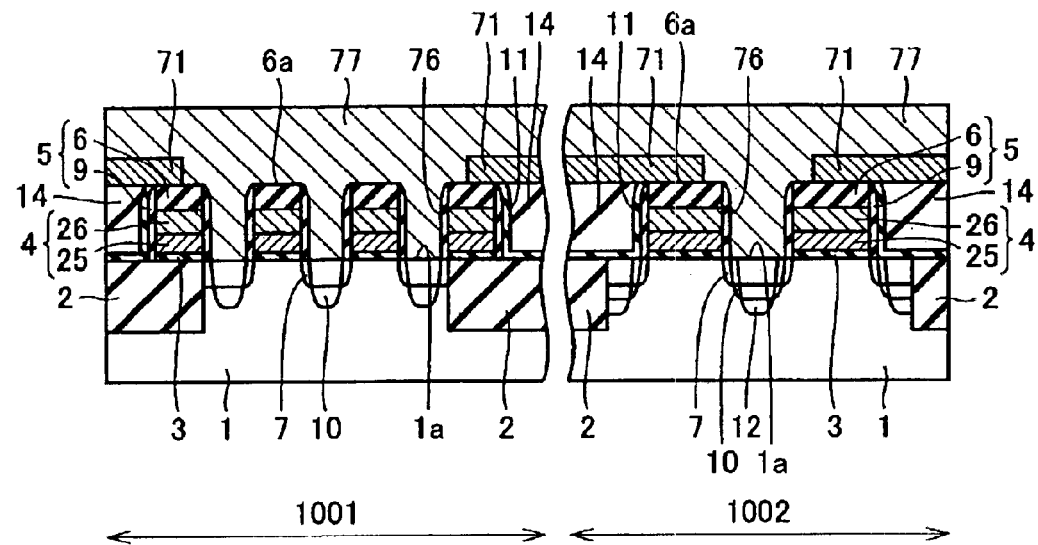

Referring to FIG. 31, conductor film 77 is deposited by CVD so as to fill pad contact hole 76 and cover insulation film 6 and silicon film 71. Conductor film 77 is formed of polysilicon or amorphous silicon doped with phosphorus or arsenic, and has a thickness of approximately 100 nm to 400 nm.

Figure 32:
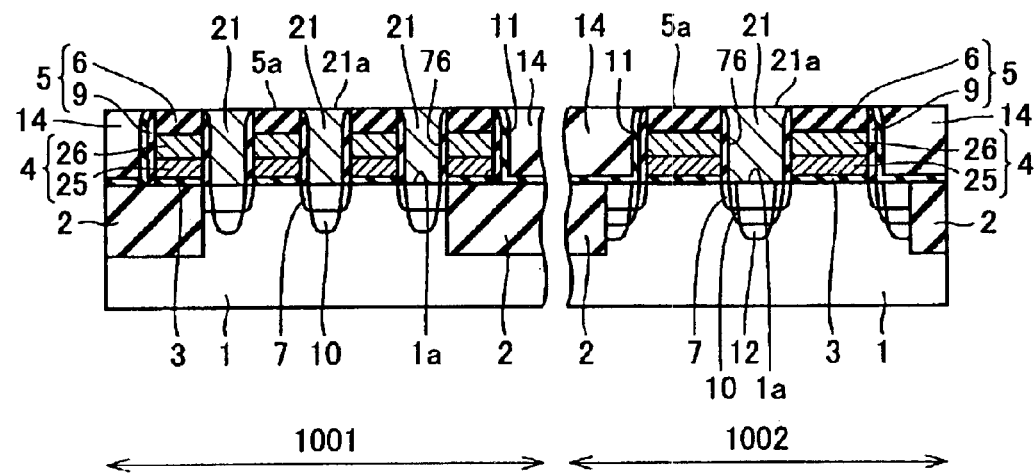

Referring to FIG. 32, conductor film 77 is polished by chemical mechanical polishing until surface 5a of gate protection film 5 appears. In other words, the polishing step of conductor film 77 is terminated between top face 6a and the bottom of insulation film 6 so that a portion of insulation film 6 remains. Therefore, pad contact 21 is formed in pad contact hole 76. Then, the fabrication method proceeds to the step of FIG. 16 of the first embodiment.

In the semiconductor device fabrication method of the third embodiment, the step of forming a mask film on interlayer insulation film 14 includes the step of forming silicon film 71 as a mask including silicon on interlayer insulation film 14.

According to the above-described semiconductor device fabrication method, the advantages of the first embodiment can be achieved. In the third embodiment, interlayer insulation film 14 is etched with silicon film 71 as a mask. When an interlayer insulation film which is an oxide film is etched, silicon film 71 is etched approximately 5 times less readily than a photoresist formed of a photosensitive material, a base resin and an organic solvent. When a photoresist is used as a mask, the sidewall of the mask will be etched away during the etching process to increase the opening formed in the mask film. This induces the possibility of the resulting pad contact hole 76 being formed in a tapered configuration. By using silicon film 71 as the mask film, the mask film per se will not be easily etched. Thus, pad contact hole 76 of a predetermined configuration, not tapered, can be provided.

Fourth Embodiment

The semiconductor device fabrication method of the fourth embodiment includes the steps of FIGS. 33–38, after the step of FIG. 15 corresponding to the first embodiment.

Figure 33:
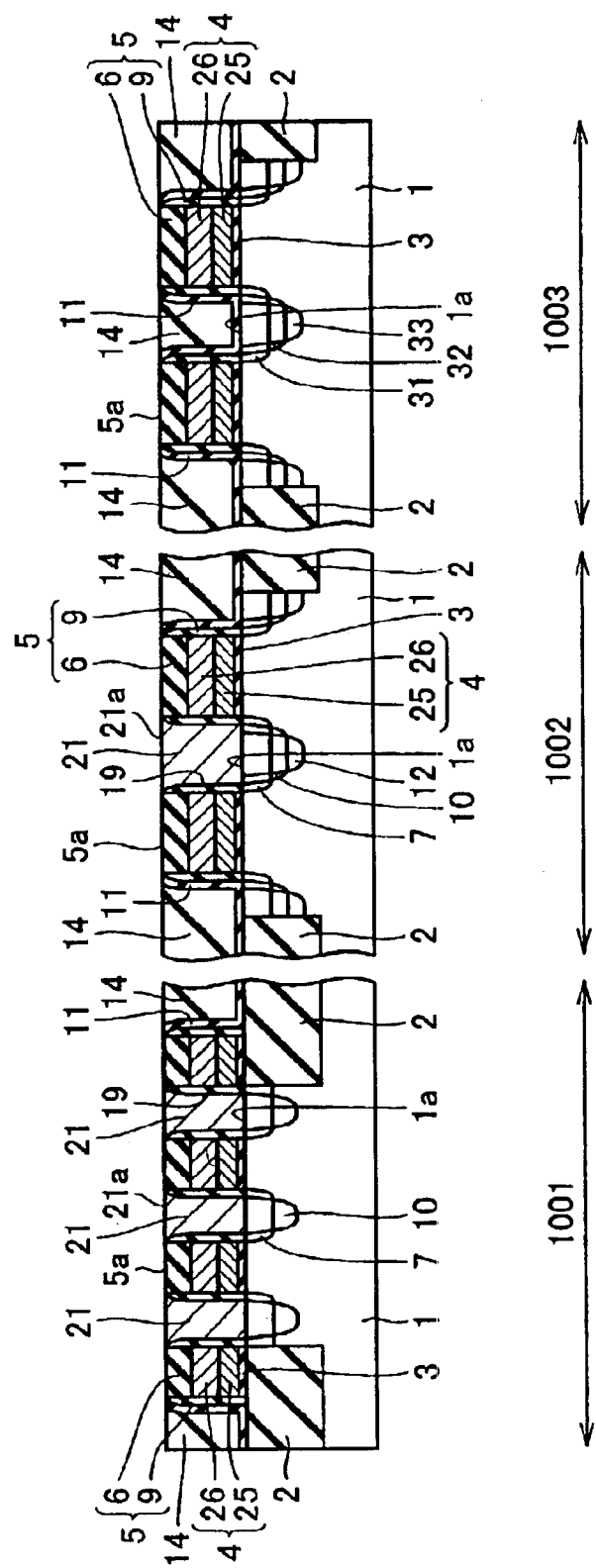
FIGS. 33–38 are sectional views of a semiconductor device showing respective steps of a fabrication method according to a fourth embodiment of the present invention.

The cross section of FIG. 33 corresponds to the cross section of FIG. 15 in the first embodiment. Referring to FIG. 33, a memory cell region 1001, a region 1002 where an n type transistor is formed in the peripheral circuit region, and a region 1003 where a p type transistor is formed in the peripheral circuit region are illustrated. In peripheral circuit region 1003 where a p type transistor is formed, p type impurity regions 31–33 of different depth are formed at main surface 1a of silicon substrate 1 located between adjacent gate electrodes 4. These p type impurity regions 31–33 are formed by carrying out the steps set forth below simultaneously in the steps shown in FIGS. 2, 5 and 7 of the first embodiment.

Referring to FIG. 2, a resist film as a mask film is formed so as to cover memory cell region 1001, and peripheral circuit region 1002 where an n type transistor is formed. In this state, impurities such as boron (B) are implanted at the dosage of $1 \times 10^{13}/cm^2$ to $1 \times 10^{14}/cm^2$ to main surface 1a of silicon substrate 1 using insulation film 6 disposed on gate electrode 4 as a mask in peripheral circuit region 1003 where p type transistors are arranged, whereby a p type impurity region 31 is formed. During the formation of n type impurity region 10 in the first embodiment, peripheral circuit region 1003 where p type transistors are formed is entirely covered with resist film as the mask film.

Referring to FIG. 5, a resist film that is a mask film is disposed so as to cover memory cell region 1001 and peripheral circuit region 1002 where an n type transistor is formed. In this state, impurities such as boron (B) are implanted at the dosage of $1 \times 10^{13}/cm^2$ to $1 \times 10^{14}/cm^2$ to main surface 1a of silicon substrate 1 using insulation film 6 and sidewall 9 as a mask in peripheral circuit region 1003 where p type transistors are arranged, whereby a p type impurity region 32 is formed. In this present step, p type impurity region 32 is formed so as to be located deeper than p type impurity region 31. During the formation of n type impurity region 10 in the first embodiment, peripheral circuit region 1003 where p type transistors are formed is entirely covered with a resist film which is the mask film.

Referring to FIG. 7, resist film which is a mask film is formed so as to cover memory cell region 1001 and peripheral circuit region 1002 where an n type transistor is formed. In this state, impurities such as boron are implanted at the dosage of $1 \times 10^{14}/cm^2$ to $1 \times 10^{15}/cm^2$ to main surface 1a of silicon substrate 1 with insulation film 6, sidewall 9 and insulation film 11 as a mask in peripheral circuit region 1003 where p type transistors are arranged, whereby p type impurity region 33 is formed. At the present step, p type impurity region 33 is formed so as to be located deeper than p type impurity region 32. During the formation of n type impurity region 12 in the first embodiment, peripheral circuit region 1003 where p type transistors are arranged is entirely covered with resist film 13 serving as a mask film.

Figure 34:
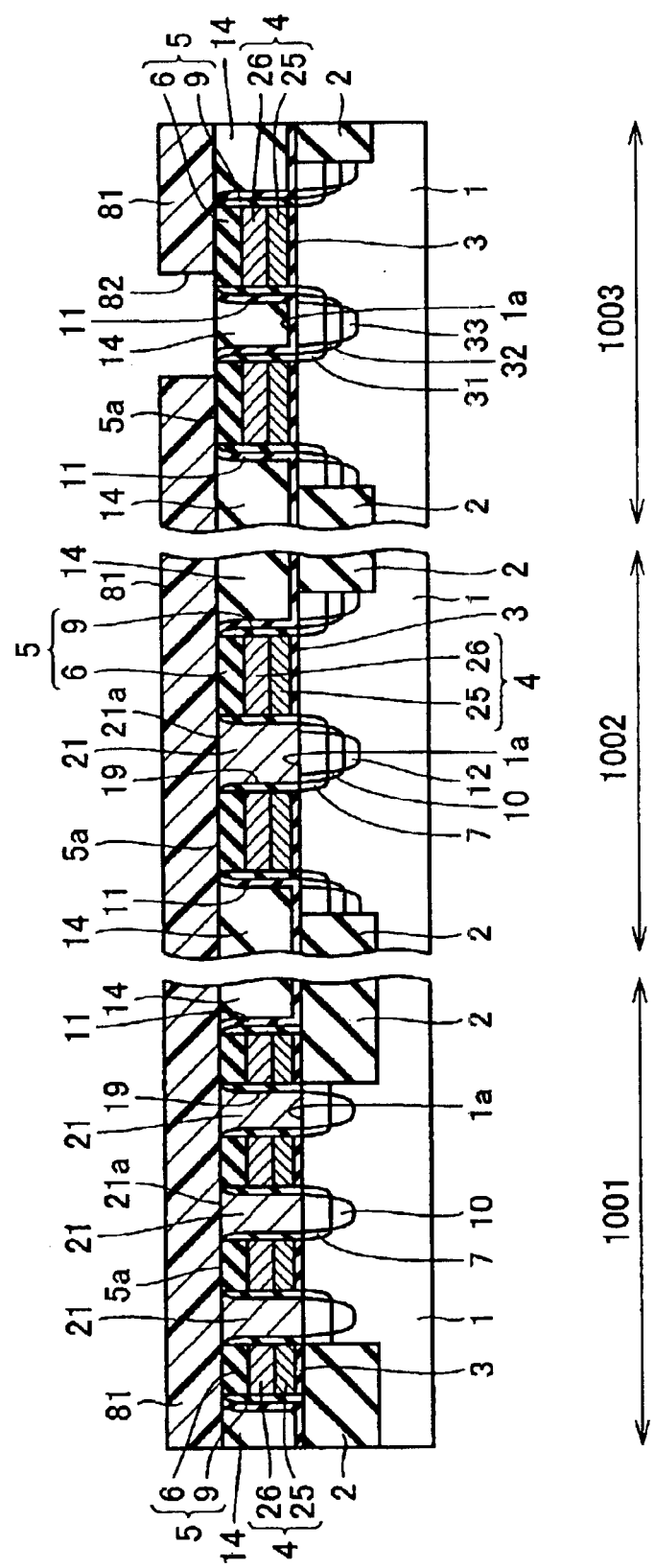

Referring to FIG. 34, a resist film 81 having an opening 82 at a predetermined position is disposed at peripheral circuit region 1003 where p type transistors are formed. Opening 82 is formed in a hole configuration so as to extend over p type impurity regions 31–33.

Figure 35:
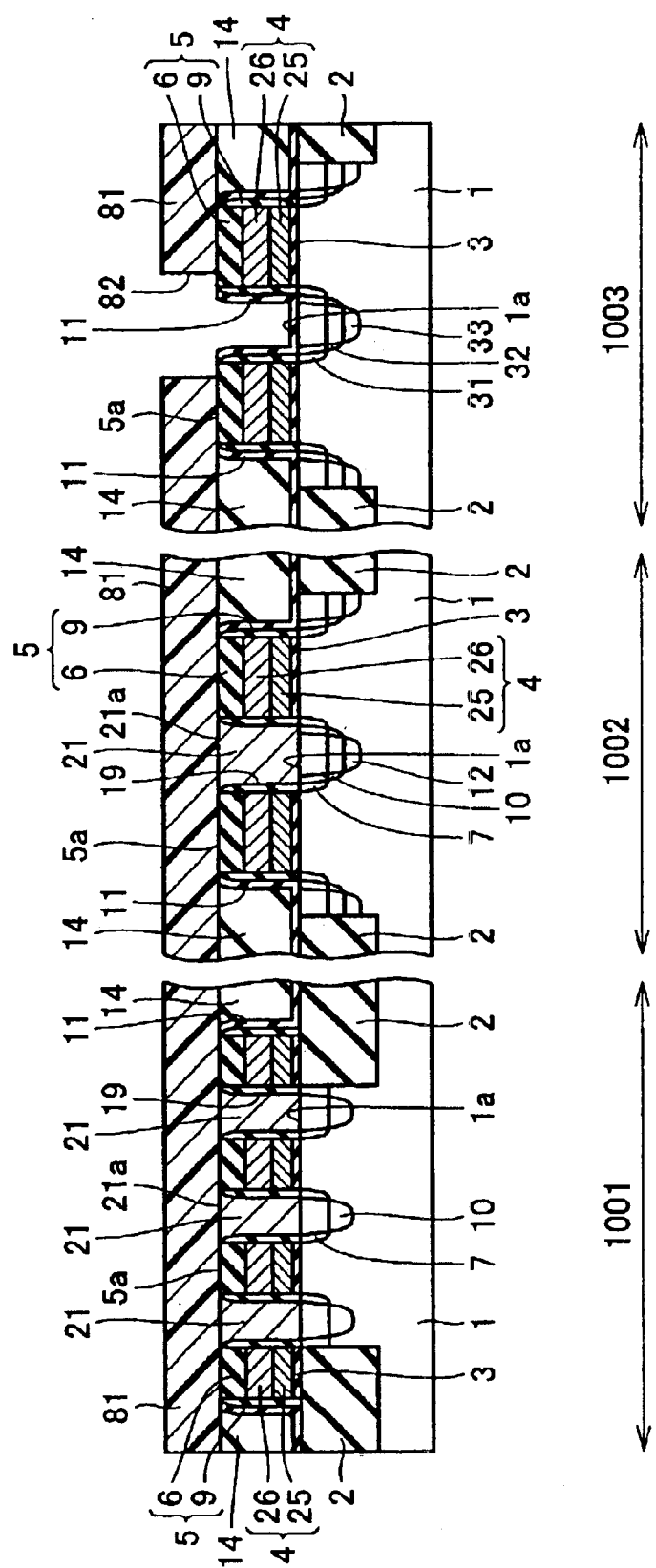

Referring to FIG. 35, interlayer insulation film 14 is subjected to dry etching such as RIE with resist film 81 as a mask. Since the etching on interlayer insulation film 14 which is an oxide film has a selectivity of at least a predetermined level with respect to the nitride film, etching can be terminated during the course of removing insulation films 6 and 11 which are nitride films. Since memory cell region 1001 and peripheral circuit region 1002 where an n type transistors is formed are entirely covered with resist film 81, they are protected from the etching step conducted on interlayer insulation film 14.

Figure 36:
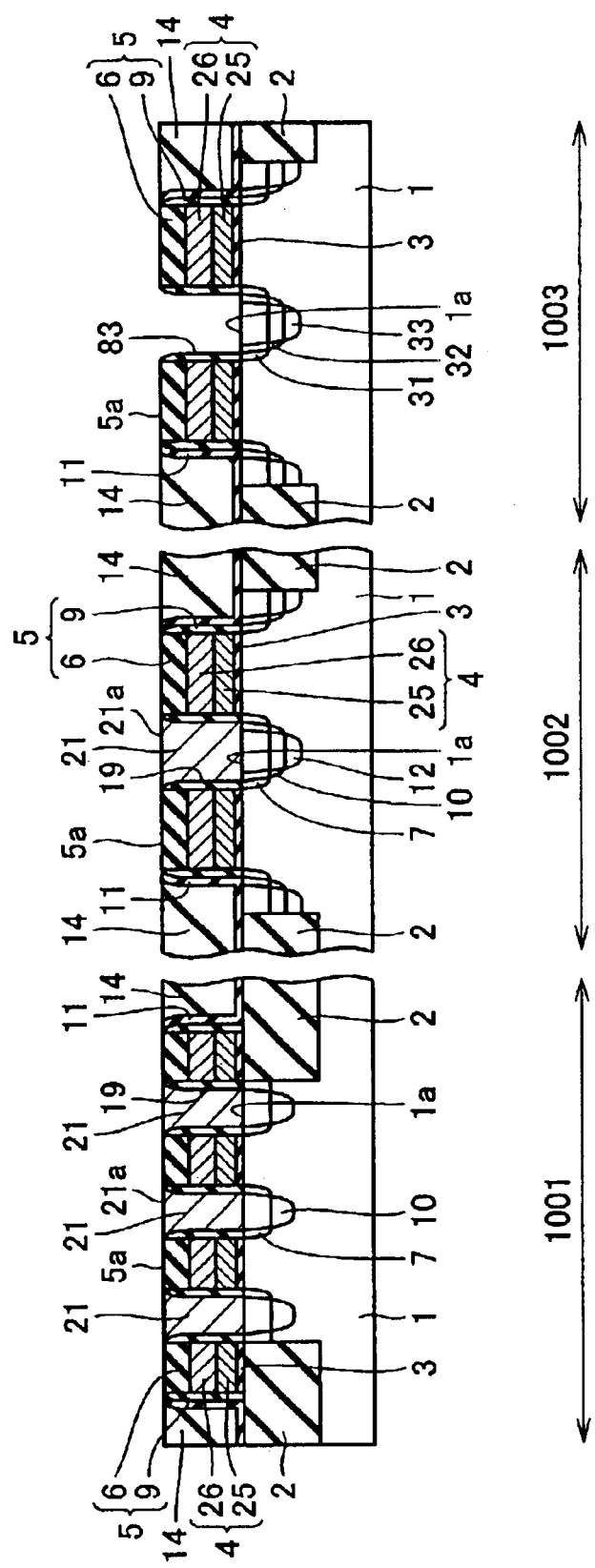

Referring to FIG. 36, insulation film 11 is subjected to dry etching such as RIE to remove any insulation film 11, after resist film 81 is removed. Between adjacent gate electrodes 4, a pad contact hole 83 having sidewall 9 as the side and reaching p type impurity regions 31–33 of silicon substrate 1 is formed.

Figure 37:
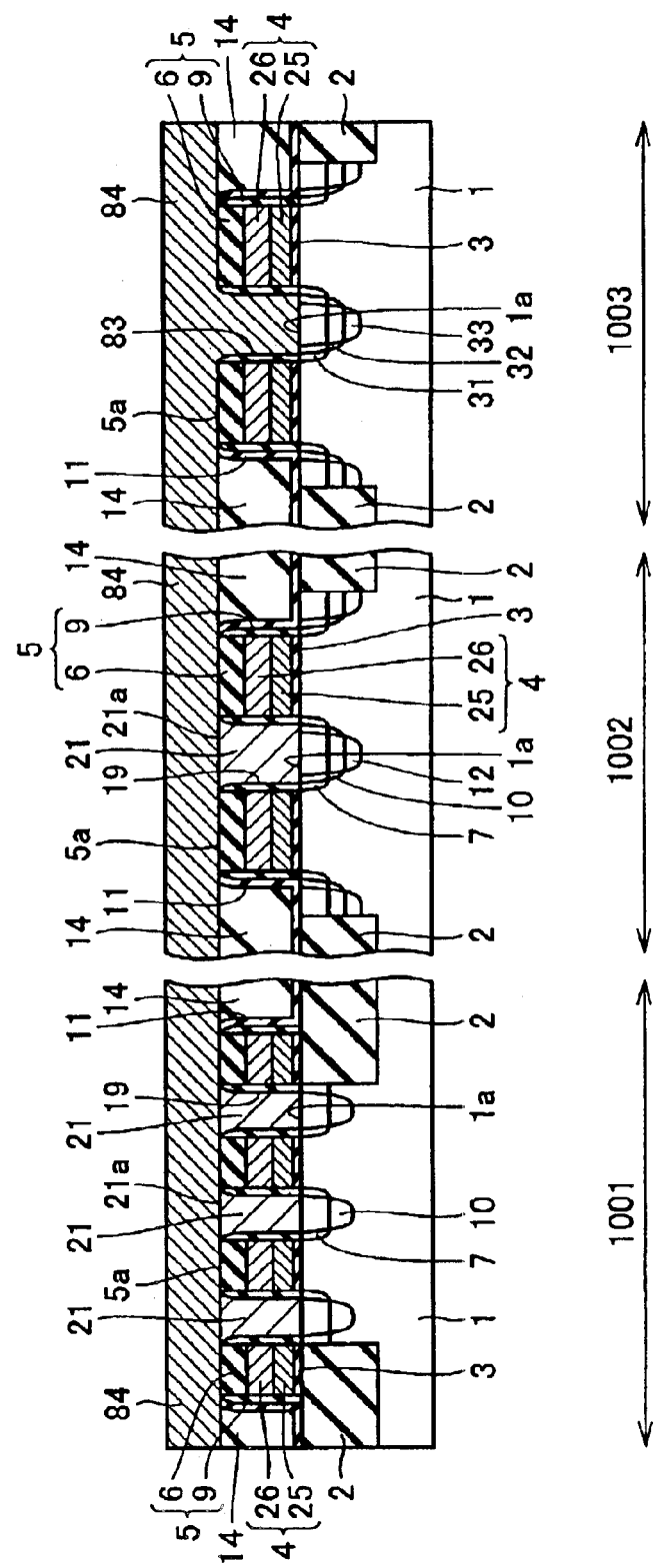

Referring to FIG. 37, a conductor film 84 is deposited by CVD so as to fill pad contact hole 83 and cover interlayer insulation film 14 and insulation film 6. Conductor film 84 is formed of polysilicon or amorphous silicon doped with boron and the like, and has a thickness of approximately 100 nm to 400 nm.

Figure 38:
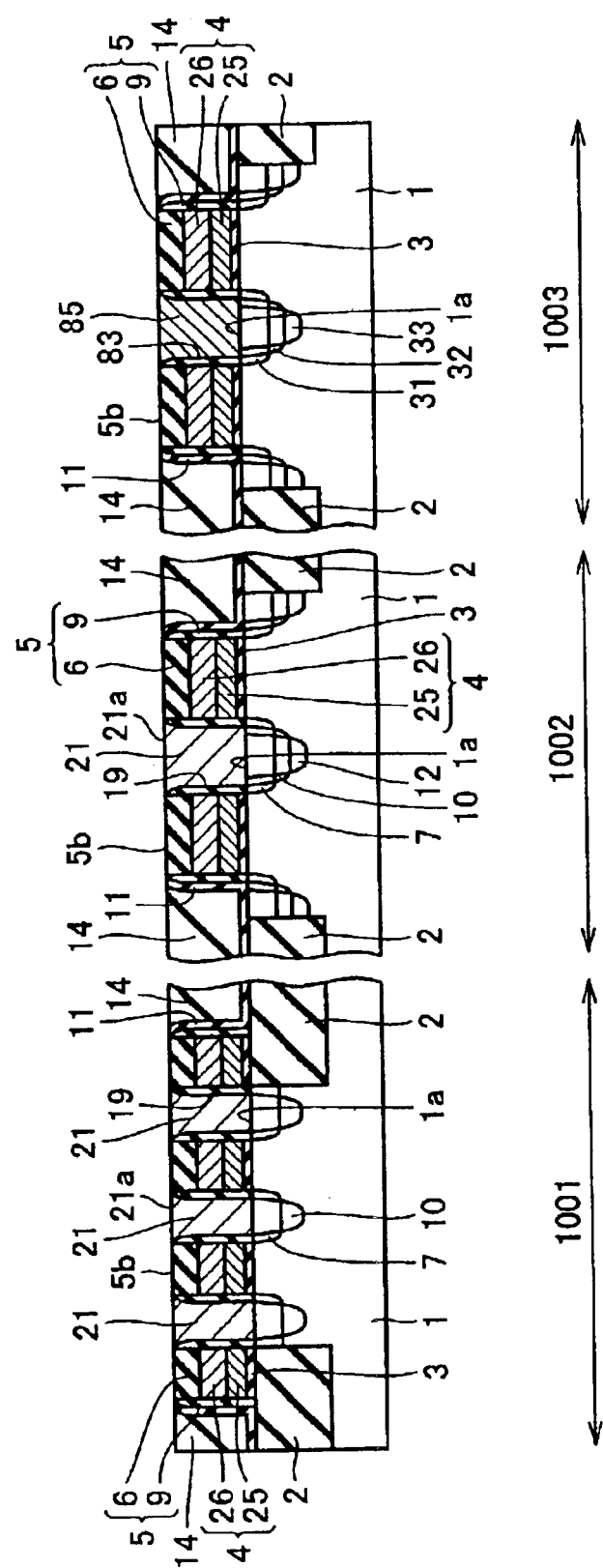

Referring to FIG. 38, conductor film 84 is polished by chemical mechanical polishing until top face 5b of gate protection film 5 appears. Top face 5b of gate protection film 5 is selected to be not higher than the height of top face 5a. In other words, the polishing process of conductor film 84 is terminated between top face 5a and the bottom of insulation film 6 so that a portion of insulation film 6 remains. Accordingly, pad contact 85 is formed in pad contact hole 83. By the present step, no conductor film 84 remains on top face 5b of gate protection film 5. Therefore, short-circuiting will not occur between pad contacts. Then, the fabrication steps of FIGS. 16–19 corresponding to the first embodiment is carried out to form a bit line at a predetermined position.

In the present embodiment, the steps shown in FIGS. 33–38 are carried out after the step of FIG. 15 of the first embodiment. Alternatively, the steps of FIGS. 33–38 can be carried out after the steps shown in FIG. 25 or 32 of the second and third embodiments.

According to the above-described semiconductor device fabrication method, interlayer insulation film 14 is polished down to top face 5a of gate protection film 5 before conductor film 84 is formed in peripheral region 1003 where p type transistors are formed. Therefore, a pad contact 85 that does not have shorting developed between pad contacts and between a pad contact and a gate electrode can be formed.

Fifth Embodiment

A semiconductor device fabrication method according to a fifth embodiment of the present invention includes the steps of FIGS. 39–44, after the step of FIG. 33 corresponding to the fourth embodiment.

Figure 39:
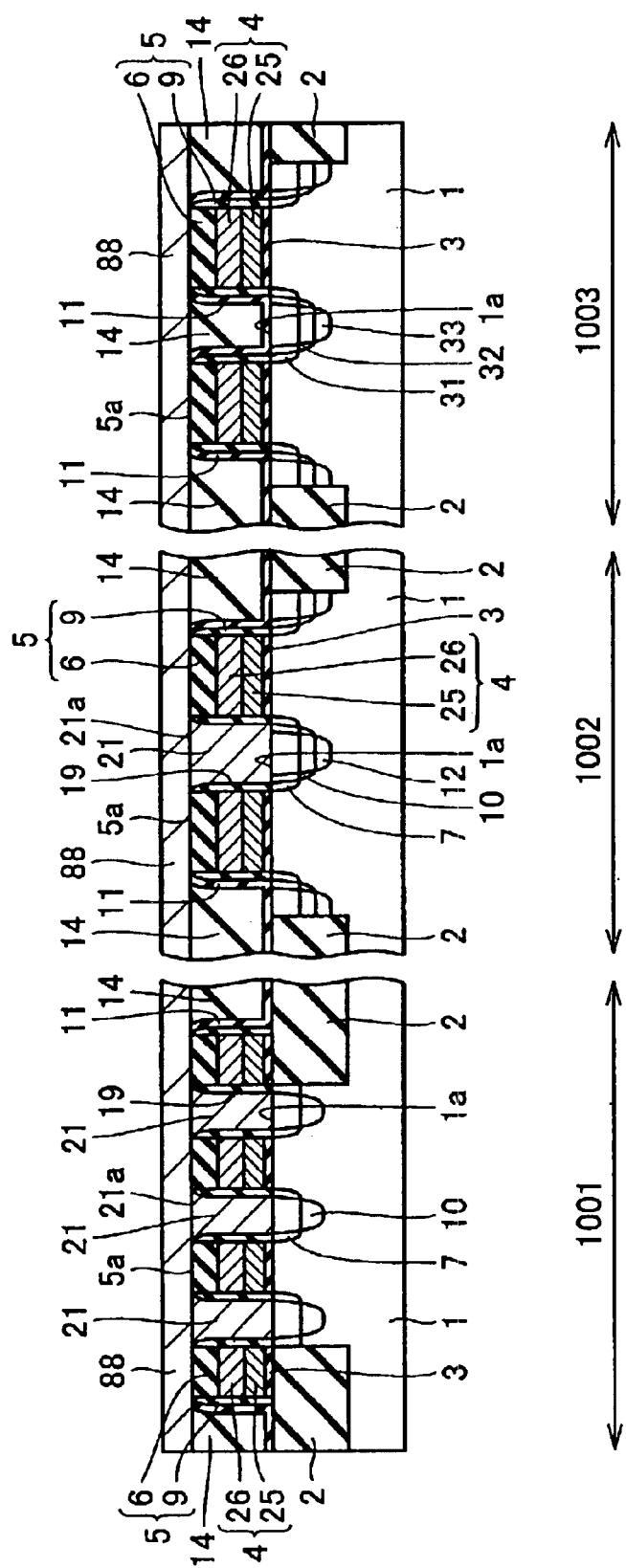
FIGS. 39–44 are sectional views of a semiconductor device showing respective steps of a fabrication method according to a fifth embodiment of the present invention.

Referring to FIG. 39, a silicon oxide film 88 is formed to the thickness of 50 nm to 150 nm so as to cover interlayer insulation film 14 and insulation film 6. Silicon oxide film 88 is a silicon oxide film deposited by CVD in reduced pressure or atmosphere pressure, doped or not doped with phosphorus and boron.

Figure 40:
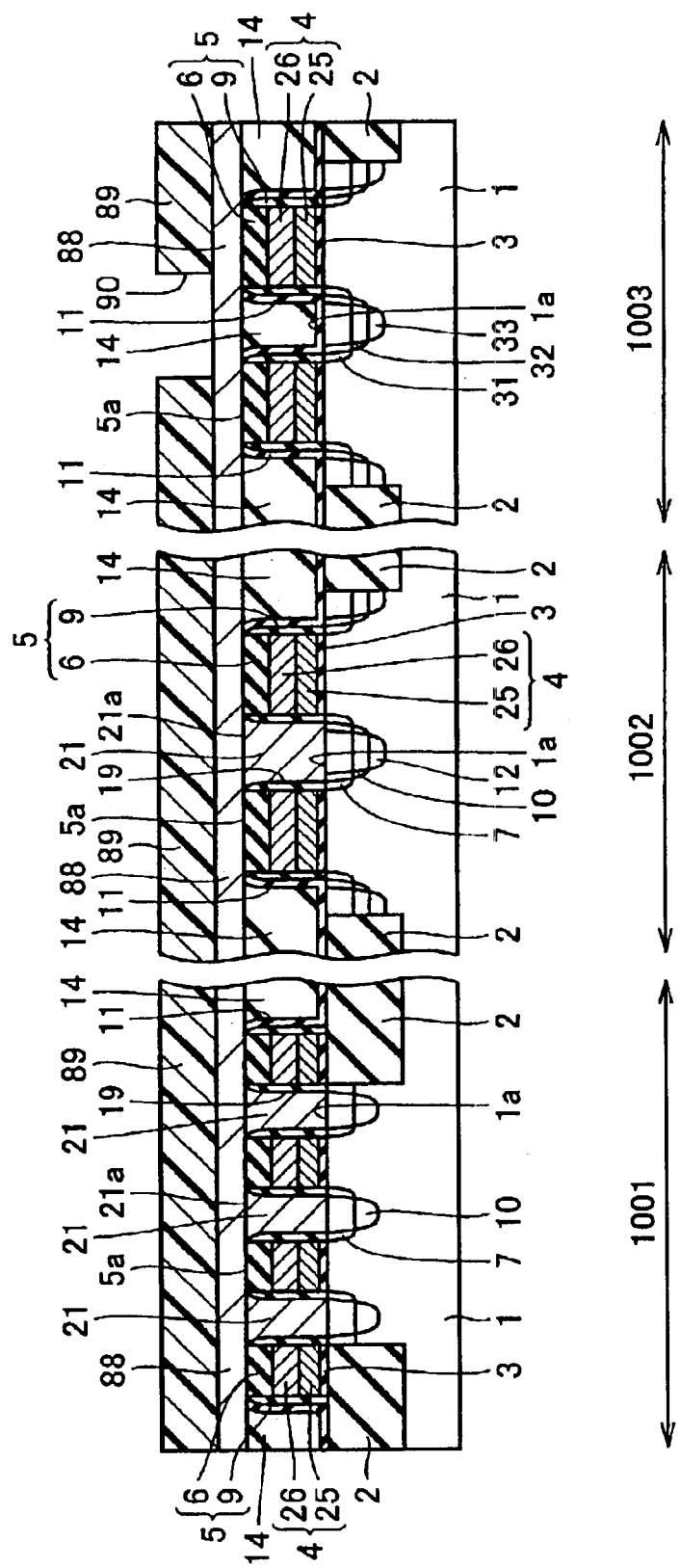

Referring to FIG. 40, a resist film 89 having an opening 90 at a predetermined position in peripheral circuit region 1003 where p type transistors are arranged is formed. Opening 90 has a hole configuration extending over p type impurity regions 31–33.

Figure 41:
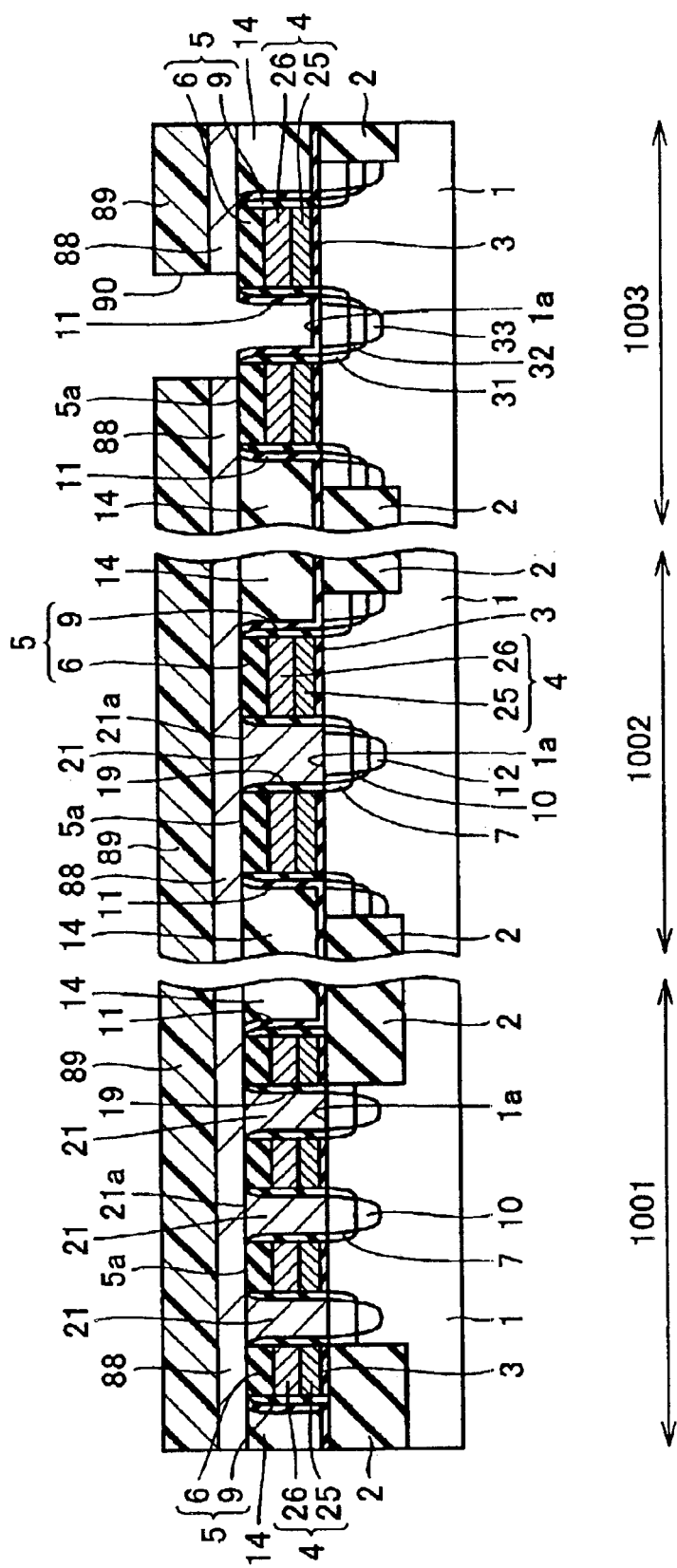

Referring to FIG. 41, silicon oxide film 88 and interlayer insulation film 14 are subjected to dry etching such as RIE with resist film 89 as a mask. Since the etching applied on interlayer insulation film 14 that is an oxide film and silicon oxide film 88 has a selectivity of at least a predetermined level to the nitride film, the etching step can be terminated during the course of removing insulation films 6 and 11 which are nitride films. During the etching step on silicon oxide film 88 and interlayer insulation film 14, memory cell region 1001 and peripheral circuit region 1002 where an n type transistor is formed are protected from etching due to the entire coverage by resist film 89.

Figure 42:
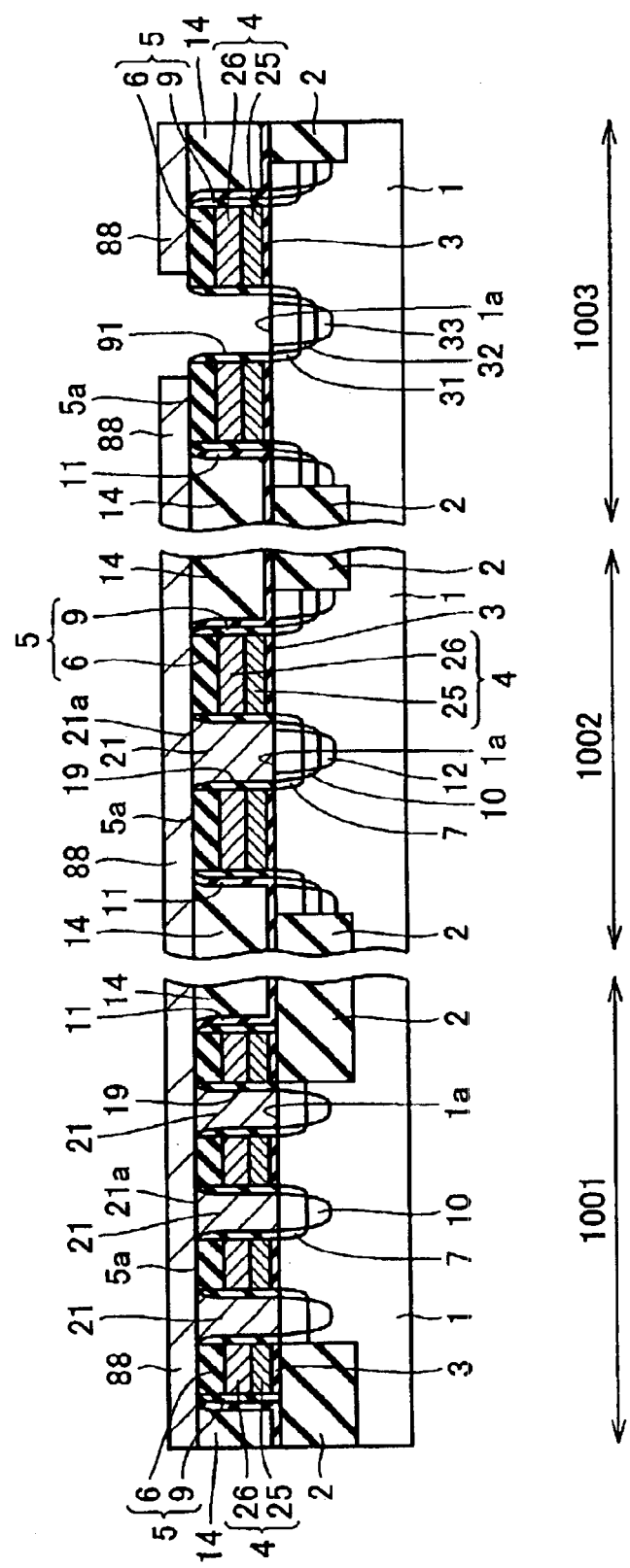

Referring to FIG. 42, following removal of resist film 89, insulation film 11 is subjected to dry etching such as RIE to remove any remaining insulation film 11. Between adjacent gate electrodes 4, a pad contact hole 91 having sidewall 9 as the side face, and reaching p type impurity regions 31–33 of silicon substrate 1 is formed.

Figure 43:
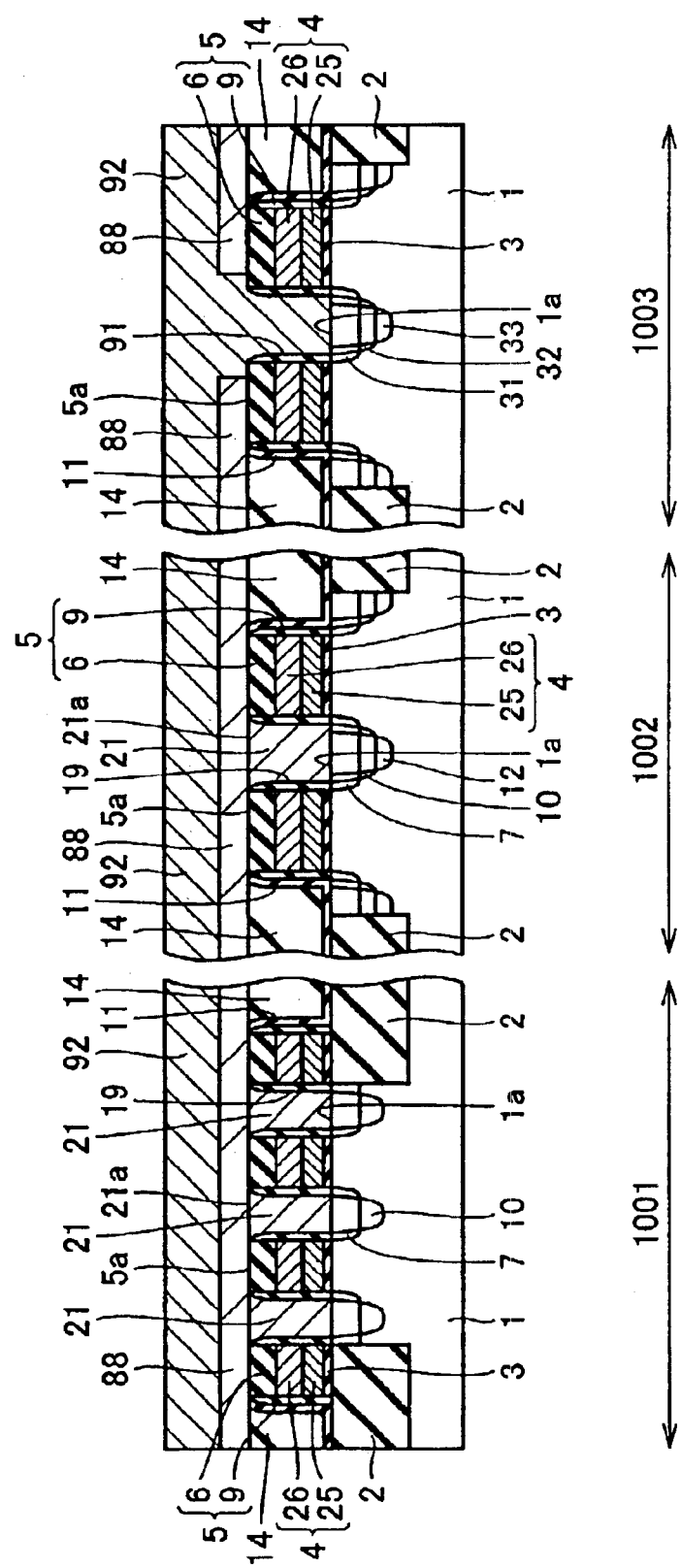

Referring to FIG. 43, a conductor film 92 is deposited by CVD so as to fill pad contact hole 91 and cover silicon oxide film 88 and insulation film 6. Conductor film 92 is formed of polysilicon or amorphous silicon implanted with boron or the like, and has a thickness of approximately 100 nm to 400 nm.

Figure 44:
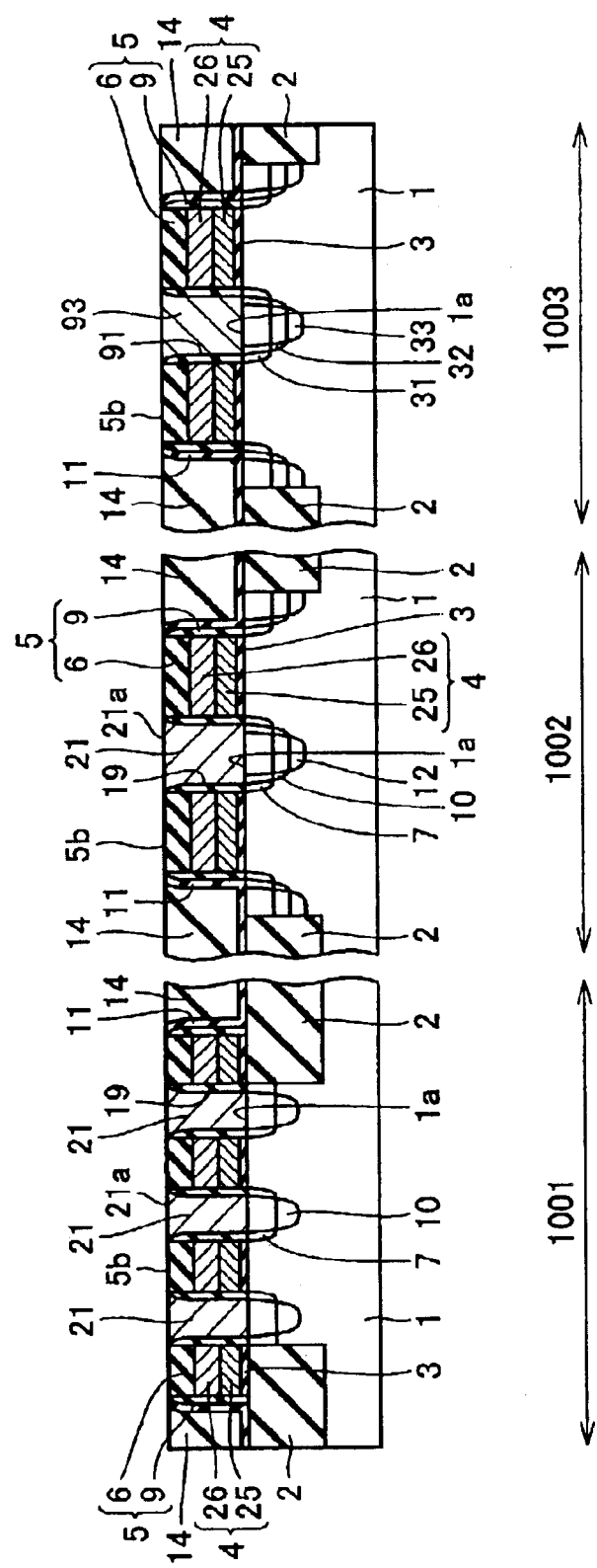

Referring to FIG. 44, conductor film 92 is polished by chemical mechanical polishing until top face 5b of gate protection film 5 appears. Top face 5b of gate protection film 5 is set to be equal to or lower than top face 5a. In other words, the polishing step of conductor film 92 is terminated between top face 5a and the bottom of insulation film 6 so that a portion of insulation film 6 remains. Thus, a pad contact 93 is formed in pad contact hole 91. By virtue of the present fabrication step, no conductor film 92 remains on top face 5b of gate protection film 5. Therefore no shorting will occur between pad contacts. Then, the fabrication steps of FIGS. 16–19 of the first embodiment are carried out to form a bit line at a predetermined position.

According to the above-described semiconductor device fabrication method, the advantages of the fourth embodiment can be achieved. In the step of etching interlayer insulation film 14 and silicon oxide film 88 with resist film 89 as a mask in the fifth embodiment, silicon oxide film 88 is formed on gate protection film 5. By conducting etching so that gate protection film 5 is not exposed at the initial stage and eventually exposed, the removed amount of gate protection film 5 covering gate electrode 4 can be controlled. Thus, short-circuiting between gate electrode 4 and pad contact 93 can be prevented in peripheral circuit region 1003 where p type transistors are formed.

Sixth Embodiment

Figure 45:
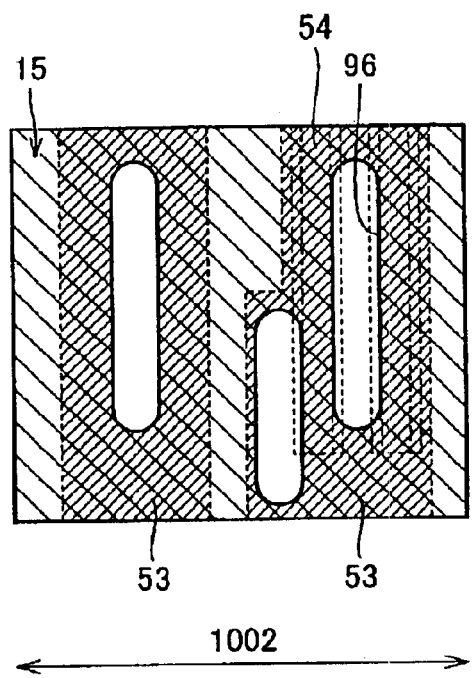
FIG. 45 is a plan view of a semiconductor device showing a step of a fabrication method according to a sixth embodiment of the present invention.

FIG. 45 corresponds to a plan view of peripheral circuit region 1002 shown in FIG. 10 of the first embodiment. A semiconductor device fabrication method according to a sixth embodiment of the present invention differs from the fabrication method of the first embodiment in that the pattern of the opening in resist film 15 covering peripheral circuit region 1002 differs from the pattern of the opening according to the fabrication steps of FIGS. 10 and 11 of the first embodiment.

Referring to FIG. 45, a resist film 15 having an opening 96 located at a predetermined position is formed in peripheral circuit region 1002. Opening 96 has an ellipse configuration in the plan view of FIG. 10 of peripheral circuit region 1002 by connecting a plurality of openings 18 in alignment with each other. An arbitrary rectangular region, each side of approximately 1$\mu$m, is selected respectively from peripheral circuit region 1002 and memory cell region 1001. An opening 96 is formed in resist film 15 so that the ratio of opening 17 occupying the selected region in memory cell region 1001 (area of opening 17/(1 $\mu$m)$^2$) approximates to the ratio of opening 96 occupying the selected region in peripheral circuit region 1002 (area of opening 96/(1 $\mu$m)$^2$). The shape of opening 96 is arbitrary, and may be a rectangular or the like.

Figure 46:
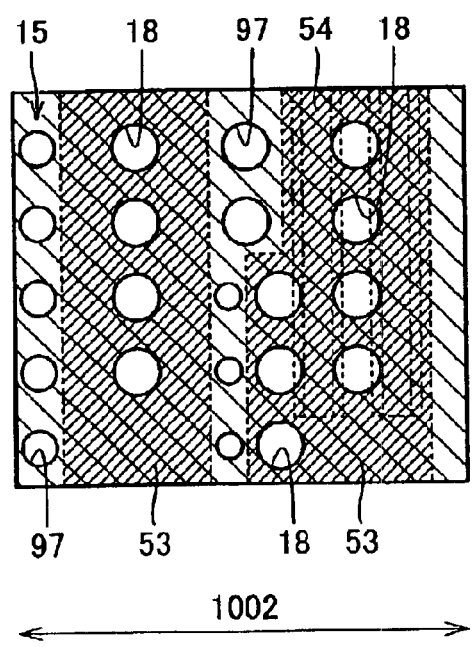
FIG. 46 is a plan view of the semiconductor device of FIG. 45 showing a modification of a step of a fabrication method thereof.
Figure 47:
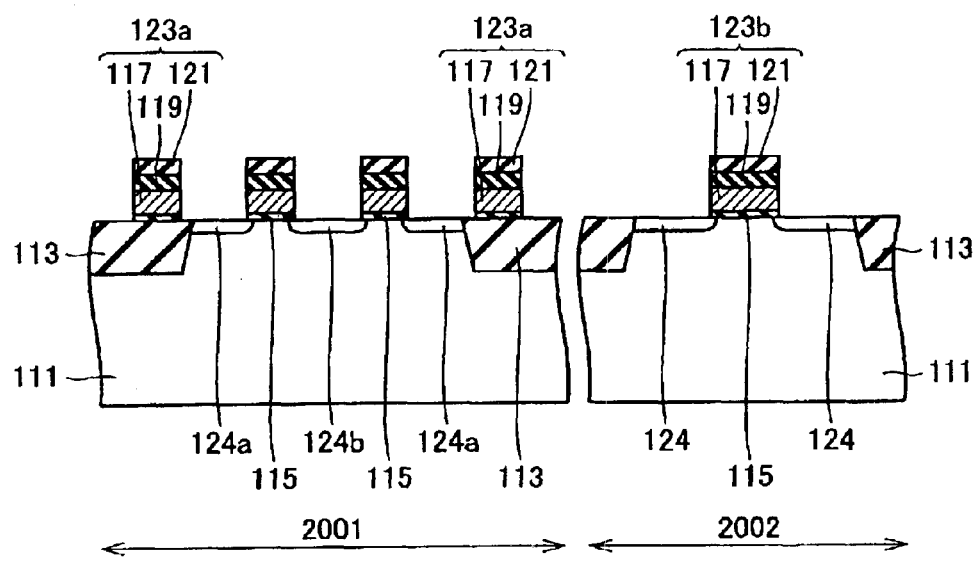
Figure 48:
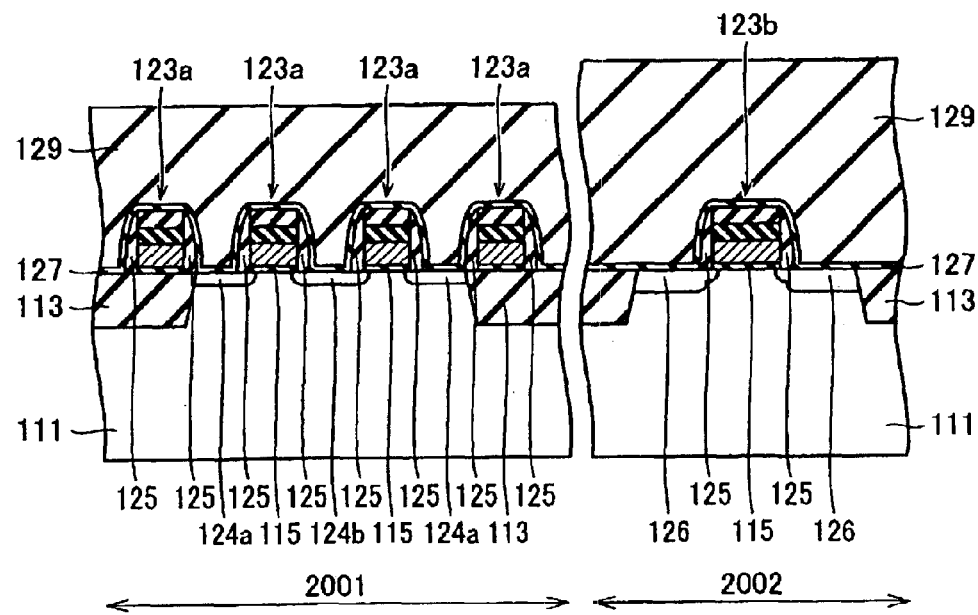
Figure 49:
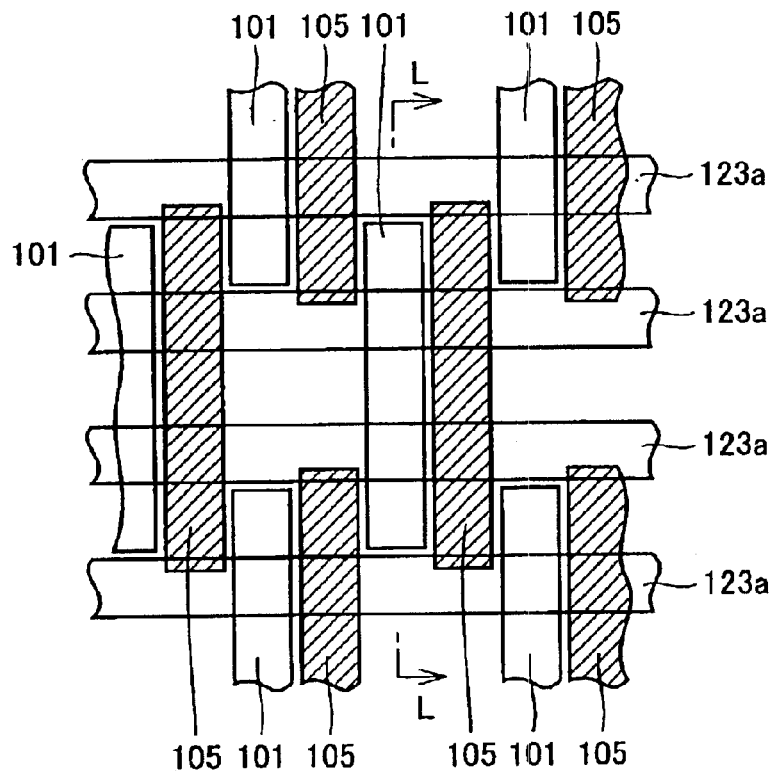
Figure 50:
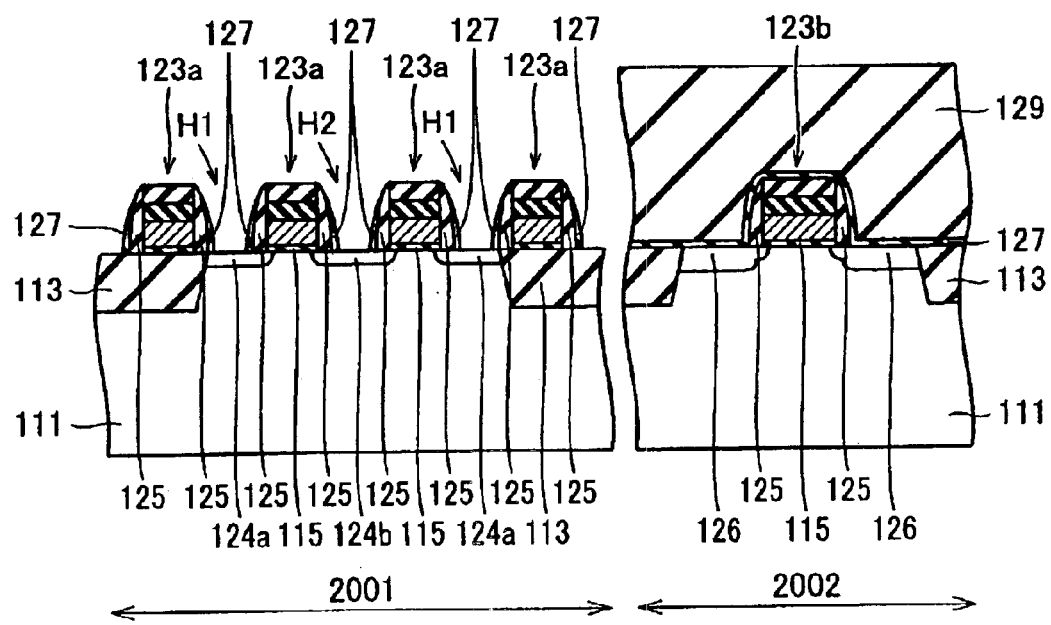
Figure 51:
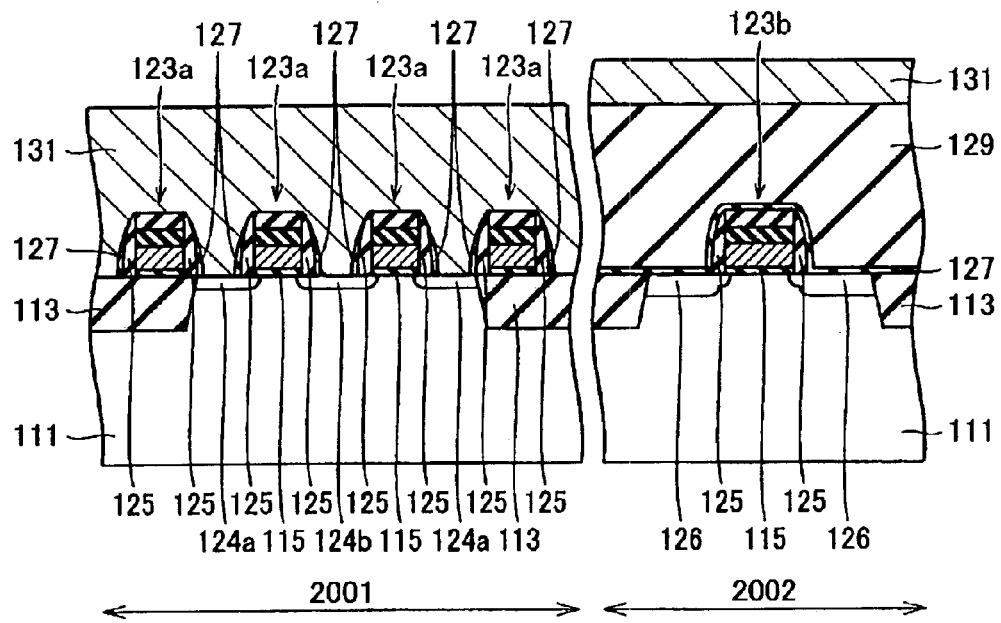
Figure 52:
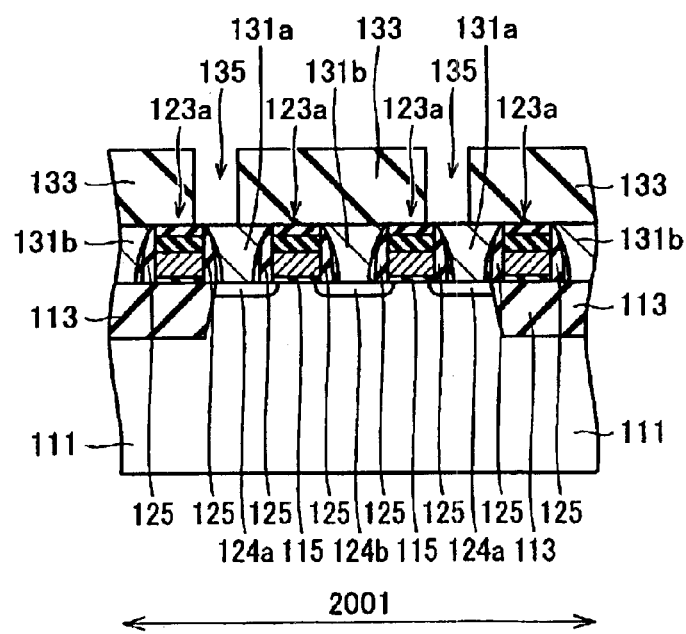

Referring to FIG. 46, a resist film 15 is disposed, having a hole-shape opening 18 formed at a predetermined position on active region 53 as well as a hole-shape opening 97 that is a dummy, formed at an arbitrary position on the isolation region that corresponds to a region other than active region 53 in peripheral circuit region 1002. An arbitrary rectangular region, each side of approximately 1 m, is selected respectively from peripheral circuit region 1002 and memory cell region 1001. Openings 18 and 97 are formed in resist film 15 so that the ratio of opening 17 occupying the selected region in memory cell region 1001 (area of opening 17/(1 $\mu$m)$^2$) approximates to the ratio of openings 18 and 97 occupying the selected region in peripheral circuit region 1002 (area of openings 18 and 97/(1 $\mu$m)$^2$).

In the semiconductor device fabrication method of the sixth embodiment, the opening ratio of opening 96 in resist film 15 that serves as a mask film formed in peripheral circuit region 1002 is made to approximate to the opening ratio of opening 17 in resist film 15 that serves as the mask film formed in memory cell region 1001.

According to the above-described semiconductor device fabrication method, the opening ratio of resist film 15 is selected so as to be analogous to each other in peripheral circuit region 1002 and memory cell region 1001. Generally speaking, the opening ratio which is the rate of the area of the opening formed in a mask film in a predetermined region, for example, an arbitrary selected region of approximately 1 $\mu$m×1 $\mu$m (the area of the region where an opening is formed in the mask film/(1 $\mu$m)$^2$) is set to approximate each other in peripheral circuit region 1002 and memory cell region 1001. Etching characteristics such as the level of the etching selectivity or the taper angle greatly differ depending whether the opening ratio of resist film 15 is high or not. For example, when the opening ratio is high, a large etching selectivity can be taken with respect to a predetermined material. In contrast, when the opening ratio is low, the etching selectivity becomes smaller. Therefore, by setting the opening ratio of resist film 15 to approximate each other in different regions, pad contact 21 can be formed in both peripheral circuit region 1002 and memory cell region 1001 with the optimum etching conditions.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device fabrication method comprising the steps of:

forming, on a main surface of a semiconductor substrate having a memory cell region and a peripheral circuit region defined in plane, a plurality of gate electrodes in said memory cell region;

forming a gate protection film covering a top face and side face of one of said gate electrodes;

forming an impurity region of a first conductivity type at the main surface of said semiconductor substrate located at both sides of said one gate electrode;

forming an interlayer insulation film so as to cover said semiconductor substrate and said gate protection film, said interlayer insulation film being made of a material more readily etchable than said gate protection film when a predetermined etchant is used;

removing said interlayer insulation film until a top face of said gate protection film is exposed;

forming on said interlayer insulation film a mask film having an opening exposing at least a portion of said exposed gate protection film, after the step of removing said interlayer insulation film;

etching said interlayer insulation film and said gate protection film using said predetermined etchant with said mask film as a mask to form a hole reaching said impurity region, and having at least a portion of a side face defining said hole formed by said gate protection film;

forming a conductor film so as to fill said hole and cover said interlayer insulation film; and forming a pad contact in said hole by leaving a portion of said conductor film in said hole, and removing other portions of said conductor film.

2. The semiconductor device fabrication method according to claim 1, further comprising a step of forming on said interlayer insulation film an insulation film of a material identical to the material of said interlayer insulation film, before forming said mask film, wherein said step of forming a mask film includes the step of forming said mask film on said insulation film.

3. The semiconductor device fabrication method according to claim 1, wherein said step of forming said mask film on said interlayer insulation film includes the step of forming said mask film including silicon on said interlayer insulation film.

4. The semiconductor device fabrication method according to claim 1, wherein said step of forming a gate electrode includes the step of forming a plurality of gate electrodes at said peripheral circuit region on the main surface of said semiconductor substrate, said step of forming said gate protection film includes the step of forming a gate protection film covering a top face and side face of said gate electrode formed at said peripheral circuit region, said step of forming said impurity region includes the step of forming an impurity region of the first conductivity type at the main surface of said semiconductor substrate located at both sides of said gate electrode formed in said peripheral circuit region, said step of forming an interlayer insulation film includes the step of forming said interlayer insulation film so as to cover said semiconductor substrate and said gate protection film formed at said peripheral circuit region, said step of removing an interlayer insulation film includes the step of removing said interlayer insulation film until a top face of said gate protection film formed at said peripheral circuit region is exposed, said step of forming a mask film includes the step of forming on said interlayer insulation film a mask film at said peripheral circuit region and having an opening exposing at least a portion of said exposed gate protection film, said step of forming a hole includes the step of etching said interlayer insulation film and said gate protection film formed at said peripheral circuit region using said predetermined etchant with said mask film as a mask to form a hole reaching said impurity region, said step of forming a conductor film includes the step of forming a conductor film so as to fill said hole formed in said peripheral circuit region and to cover said interlayer insulation film, and said step of forming a pad contact includes the step of forming a pad contact in said hole by leaving a portion of said conductor film in said hole formed at said peripheral circuit region and removing other portions of said conductor film.

5. The semiconductor device fabrication method according to claim 4, wherein an opening ratio of an opening in said mask film formed in said peripheral circuit region is made to approximate to the opening ratio of an opening in said mask film formed in said memory cell region.

6. The semiconductor device fabrication method according to claim 1, wherein in said step of removing said interlayer insulation film, said interlayer insulation film is removed by chemical mechanical polishing, and in said step of forming a pad contact, said conductor film is removed by chemical mechanical polishing.

* * * * *